United States Patent
Matsuda

(10) Patent No.: US 9,083,361 B2
(45) Date of Patent: Jul. 14, 2015

(54) ADPLL

(71) Applicant: FUJITSU LIMITED, Kawasaki-shi, Kanagawa (JP)

(72) Inventor: Atsushi Matsuda, Akishima (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/263,065

(22) Filed: Apr. 28, 2014

(65) Prior Publication Data

US 2014/0232473 A1   Aug. 21, 2014

Related U.S. Application Data

(63) Continuation of application No. PCT/JP2011/076834, filed on Nov. 21, 2011.

(51) Int. Cl.
| | | |
|---|---|---|
| *H03L 7/095* | (2006.01) | |
| *H03L 7/091* | (2006.01) | |
| *H03L 7/093* | (2006.01) | |
| *H03L 7/07* | (2006.01) | |
| *H03L 7/14* | (2006.01) | |

(52) U.S. Cl.
CPC ............. *H03L 7/095* (2013.01); *H03L 7/091* (2013.01); *H03L 7/093* (2013.01); *H03J 2200/10* (2013.01); *H03L 7/07* (2013.01); *H03L 7/146* (2013.01); *H03L 2207/50* (2013.01)

(58) Field of Classification Search
CPC ....... H03L 7/095; H03L 7/07; H03L 2207/50; H03L 7/146; H03L 7/091; H03L 7/093; H03J 2200/10
USPC ...... 331/1 A, 1 R, 16, 34, 177 R, 179, 177 V; 327/150, 159; 375/376
See application file for complete search history.

(56) References Cited

U.S. PATENT DOCUMENTS

2009/0207961 A1   8/2009   Sai

FOREIGN PATENT DOCUMENTS

| JP | 2009-194611 | 8/2009 |
| JP | 2011-023938 | 2/2011 |

OTHER PUBLICATIONS

Altabban, Wissam et al., "Merged Digitally Controlled Oscillator and Time to Digital Converter for TV band ADPLL", Proceedings of 2010 IEEE International Symposium on Circuits and Systems (ISCAS), May 30, 2010, pp. 1987-1990.
International Search Report, mailed in connection with PCT/JP2011/076834 and mailed Feb. 14, 2012.
JPOA—Office Action mailed on Apr. 14, 2015 issued with respect to the corresponding Japanese Patent Application No. 2013-545675 with partial English translation.

*Primary Examiner* — Arnold Kinkead
*Assistant Examiner* — Richard Tan
(74) *Attorney, Agent, or Firm* — Fujitsu Patent Center

(57) ABSTRACT

An ADPLL includes a digital controlled oscillator, a first counter counting a number of clocks from the digital controlled oscillator, a second counter to count a multiplication number representing a number of the clocks in a reference clock, a TDC detecting a delayed amount of a phase of the clocks against a phase of the reference clock, an adder adding the delayed amount to a difference between the multiplication number and the number of clocks, a slew rate setting part setting a slew rate of the clocks, an ADC receiving the clocks to which the slew rate is set, a switching part switching between an output of the adder and an output of the ADC, and a controller controlling the slew rate by shifting a phase of the clocks to set a slew rate while the ADLL is locked by utilizing the TDC.

7 Claims, 18 Drawing Sheets

FIG.5A
FIG.5B
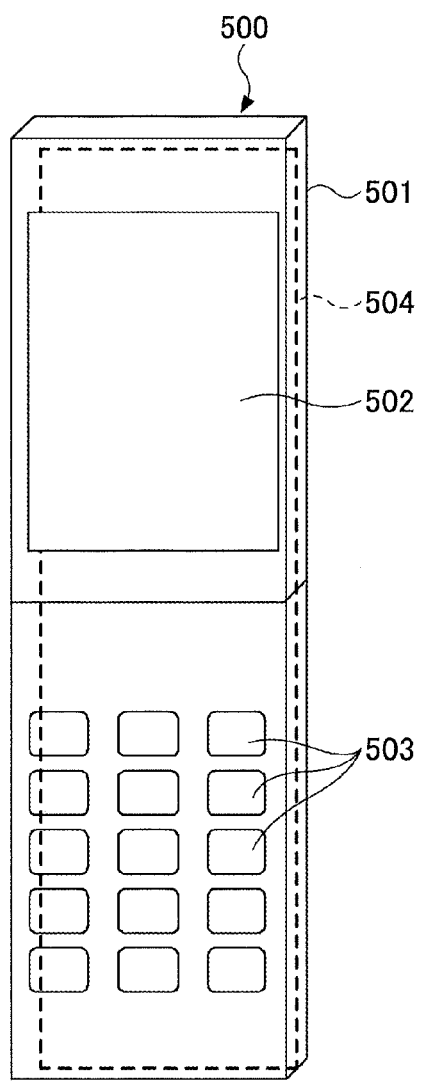
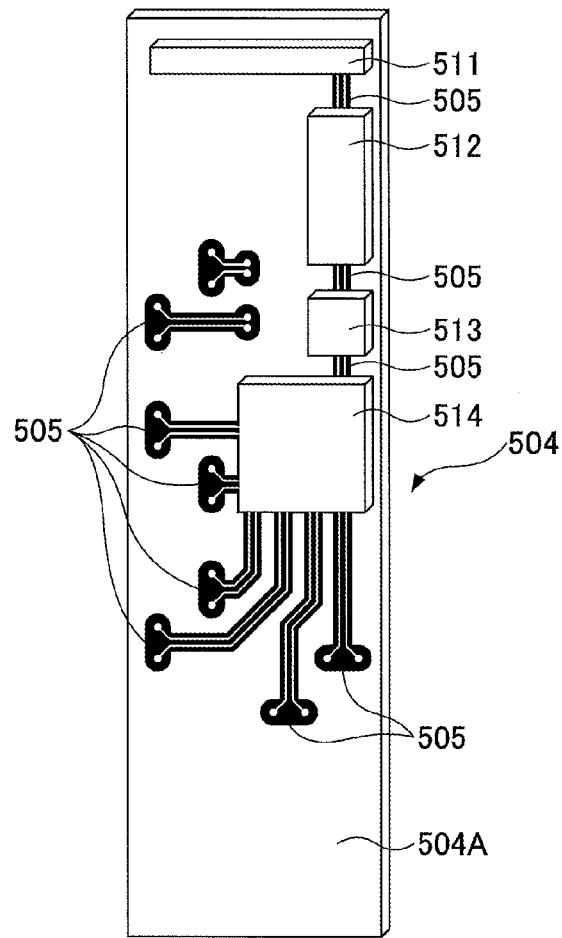

FIG.17

| COUNTER CODE | 0 | 1 | ... | 9 | 10 | ... | 14 | 15 |
|---|---|---|---|---|---|---|---|---|
| OUTPUT CODE | 70 | 90 | | 140 | 110 | | 80 | 60 |

ADPLL

CROSS-REFERENCE TO RELATED APPLICATIONS

This application is a continuation application of International Application PCT/JP2011/076834 filed on Nov. 21, 2011 and designates the U.S., the entire contents of which are incorporated herein by reference.

FIELD

The disclosures discussed herein relate to an ADPLL (all digital phase-locked loop).

BACKGROUND

There is disclosed in the related art a PLL (phase lock loop) that includes a reference signal generator, a control oscillator, a TDC (time to digital converter), a digital filter, a phase detector, an analog filter, an amplifier, a lock detector, and switches.

However, in the related art PLL, the TDC includes plural inverters, and quantization is performed by utilizing a delayed time between the inverters. Hence, the resolution of the related art PLL is restricted by the delayed time of the inverters of the TDC. Since the delayed time of the inverters has limitation, the resolution of the related art PLL is low due to an insufficient handling ability of the PLL with respect to a high clock frequency.

RELATED ART DOCUMENTS

Patent Document

Patent Document 1: Japanese Laid-open Patent Publication No. 2009-194611

SUMMARY

Accordingly, it may be desirable to provide an ADPLL capable of exhibiting high resolution.

According to an aspect of an embodiment, there is provided an ADPLL that includes a digital controlled oscillator; a first counter configured to count a number of clocks fed back from the digital controlled oscillator; a second counter configured to count a multiplication number representing a number of the clocks included in a reference clock; a TDC configured to detect a delayed amount of a phase of the clocks fed back from the digital controlled oscillator with respect to a phase of the reference clock; an adder configured to add the delayed amount detected by the TDC to a difference between the multiplication number counted by the second counter and the number of clocks counted by the first counter, and output the added result; a slew rate setting part configured to receive the clocks fed back from the digital controlled oscillator to set a slew rate of the fed back clocks; an ADC connected to an output side of the slew rate setting part and configured to receive the clocks to which the slew rate is set by the slew rate setting part; a switching part configured to selectively switch between an output of the adder and an output of the ADC as an input into the digital controlled oscillator; and a controller configured to control the slew rate in the slew rate setting part while shifting a phase of the clocks input from the TDC to the digital controlled oscillator to set a slew rate that realizes a lock point in the ADC in a status where the ADLL is locked by utilizing the TDC when the input of the digital controlled oscillator is switched from the output of the adder to the output of the ADC.

The object and advantages of the invention will be realized and attained by means of the elements and combinations particularly pointed out in the appended claims.

It is to be understood that both the foregoing general description and the following detailed description are exemplary and explanatory and are not restrictive of the invention as claimed.

BRIEF DESCRIPTION OF DRAWINGS

FIGS. 5A and 5B are diagrams illustrating a mobile phone terminal 500 including an ADPLL 100 of a first embodiment;

FIG. 17 is a diagram illustrating an example of 4-bit table data for use in the process of switching from the TDC 50 to the ADC 70 in the ADPLL 200 of the second embodiment.

DESCRIPTION OF EMBODIMENTS

In the following, a description is given of an ADPLL (all digital phase locked loop) to which preferred embodiments of the present invention are applied.

Initially, the comparative example of the ADPLL is illustrated prior to illustration of an ADPLL of the embodiments.

Figure 1:
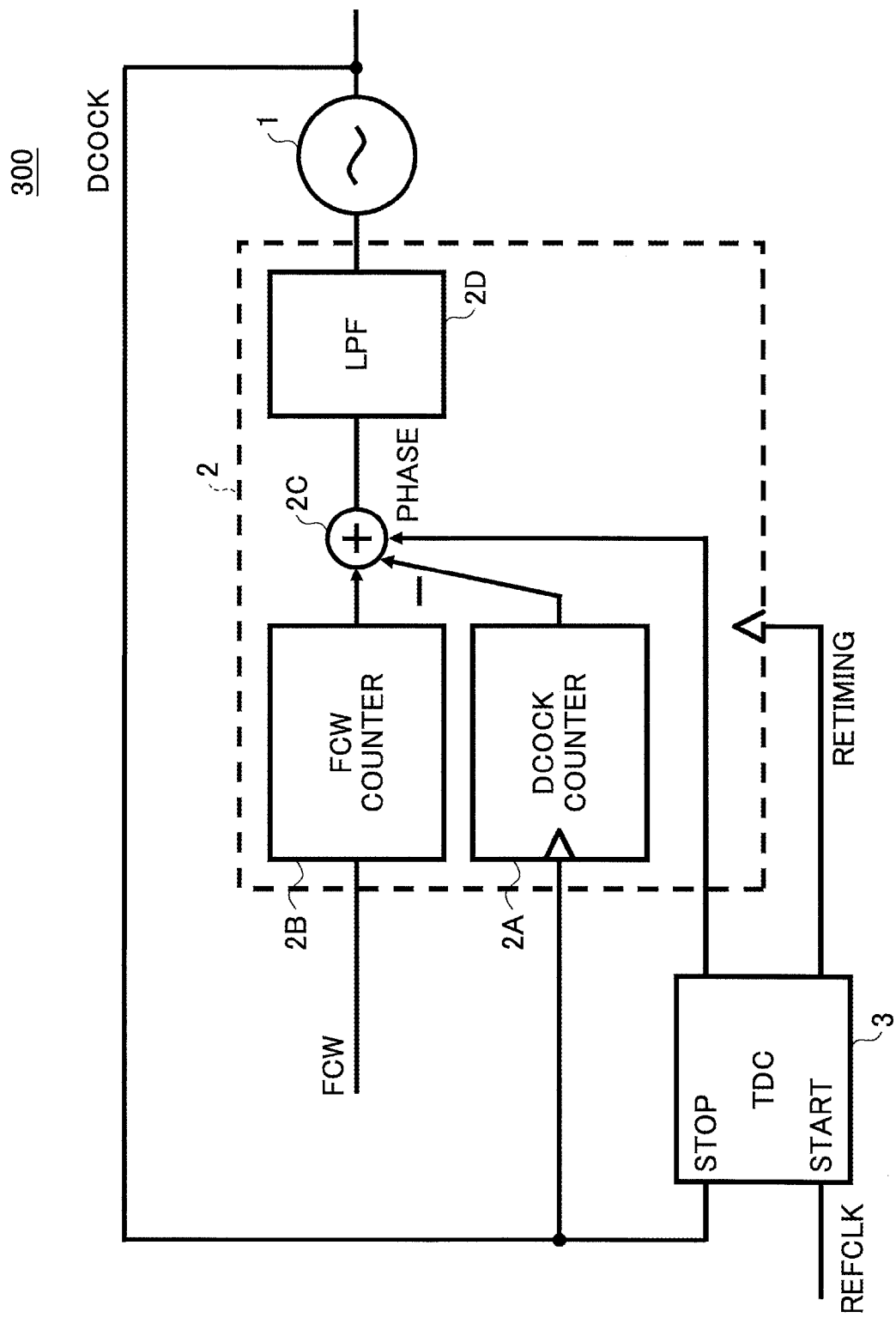
FIG. 1 is a block diagram illustrating a configuration of an ADPLL 300 of a comparative example.

FIG. 1 is a block diagram illustrating a comparative example of a ADPLL 300.

The ADPLL 300 of the comparative example includes a DCO (digitally controlled oscillator) 1, a logic circuit 2, and a TDC (time to digital converter) 3 as main components. The logic circuit 2 includes a DCOCK counter 2A, an FCW (multiplication number) counter 2B, an adder 2C, and an LPF (low pass filter) 2D as main components.

The DCO 1 is connected to an output side of the logic circuit 2, and is configured to receive a control voltage output from the LPF 2D. The DCO 1 is configured to output a clock of DCOCK, a phase of which is controlled based on the control voltage received from the LPF 2D.

Of the components of the ADPLL 300, the logic circuit 2 is a digital circuit that may be implemented by a semiconductor LSI (large scale integration circuit), for example.

In the logic circuit 2, respective outputs of the DCOCK counter 2A and the FCW counter 2B are connected to an input terminal of an adder 2C. The polarity of the output of the DCOCK counter 2A is inverted, and the output of the DCOCK counter 2A having now the inverted polarity is then supplied to the adder 2C. The input terminal of the adder 2C is also connected to a TDC 3. An output terminal of the adder 2C is connected to an input terminal of the LPF 2D. An output terminal of the LPF 2D is connected to an input terminal of the DCO 1.

The clock of DCOCK of the DCO 1 is fed back to and input into the DCOCK counter 2A. The DCOCK counter 2A is configured to count the clock of DCOCK supplied from the DCO 1, and output the counted number of the clocks of DCOCK (hereinafter may be simply abbreviated as the "counted number" where appropriate) to the adder 2C when the DCOCK counter 2A receives a retiming signal RETIMING from the TDC 3. The polarity of the counted number of the clocks of DCOCK counter 2A is inverted into a negative sign, and the output of the DCOCK counter 2A having now the negative sign is then supplied to the adder 2C.

The FCW counter 2B includes a multiplication number representing an FCW (frequency command word). The FCW is a setting value representing the number of clocks of DCOCK included in one period of a reference clock REFCLK.

Note that the reference clock REFCLK is a signal serving as a reference for operations of the ADPLL 300. An example of such a reference clock REFCLK may be a highly accurate clock supplied from a quartz oscillator. Further, 100 may be set as the FCW as an example.

The FCW counter 2B counts a number of clocks by integrating the FCW every time the retiming signal RETIMING is input from the TDC 3, and outputs the counted number into the adder 2C.

The adder 2C outputs a value obtained by adding a delayed amount input from the TDC 3 to a value obtained by subtracting the counted number input from the DCOCK counter 2A from the counted number input from the FCW counter 2B. The output of the adder 2C is a phase error signal PHASE representing a phase error, and is supplied to the LPF 2D.

The LPF 2D is a so-called loop circuit. The LPF 2D serves as a filter configured to integrate the phase error signal PHASE input from the adder 2C to output the integrated phase error signal PHASE as a control voltage of the DCO 1. When the LPF 2D receives a retiming signal RETIMING from the TDC 3, the LPF 2D outputs a control voltage to the DCO 1.

A start terminal (START) of the TDC 3 receives the reference clock REFCLK, and a stop terminal (STOP) of the TDC 3 receives the clock of DCOCK. The TDC 3 supplies to the adder 2C a delayed signal representing a delayed amount of a phase of the clocks of DCOCK with respect to the reference clock REFCLK.

The delayed amount output by the TDC 3 represents the amount of delay from a rise of the reference clock REFCLK to a rise of the first clock of DCOCK after the rise of the reference clock REFCLK.

Further, when the stop terminal (STOP) of the TDC 3 receives the first clock of DCOCK after the start terminal (START) of the TDC 3 has received the reference clock REFCLK, the TDC 3 outputs the retiming signal RETIMING. The retiming signal RETIMING is supplied to the DCOCK counter 2A, the FCW counter 2B, and the LPF 2D.

The ADPLL 300 having the above configuration adjusts the phase of the clock of DCOCK such that the phase of the clock of DCOCK output from the DCO 1 is equal to that of the reference clock REFCLK.

Figure 2:
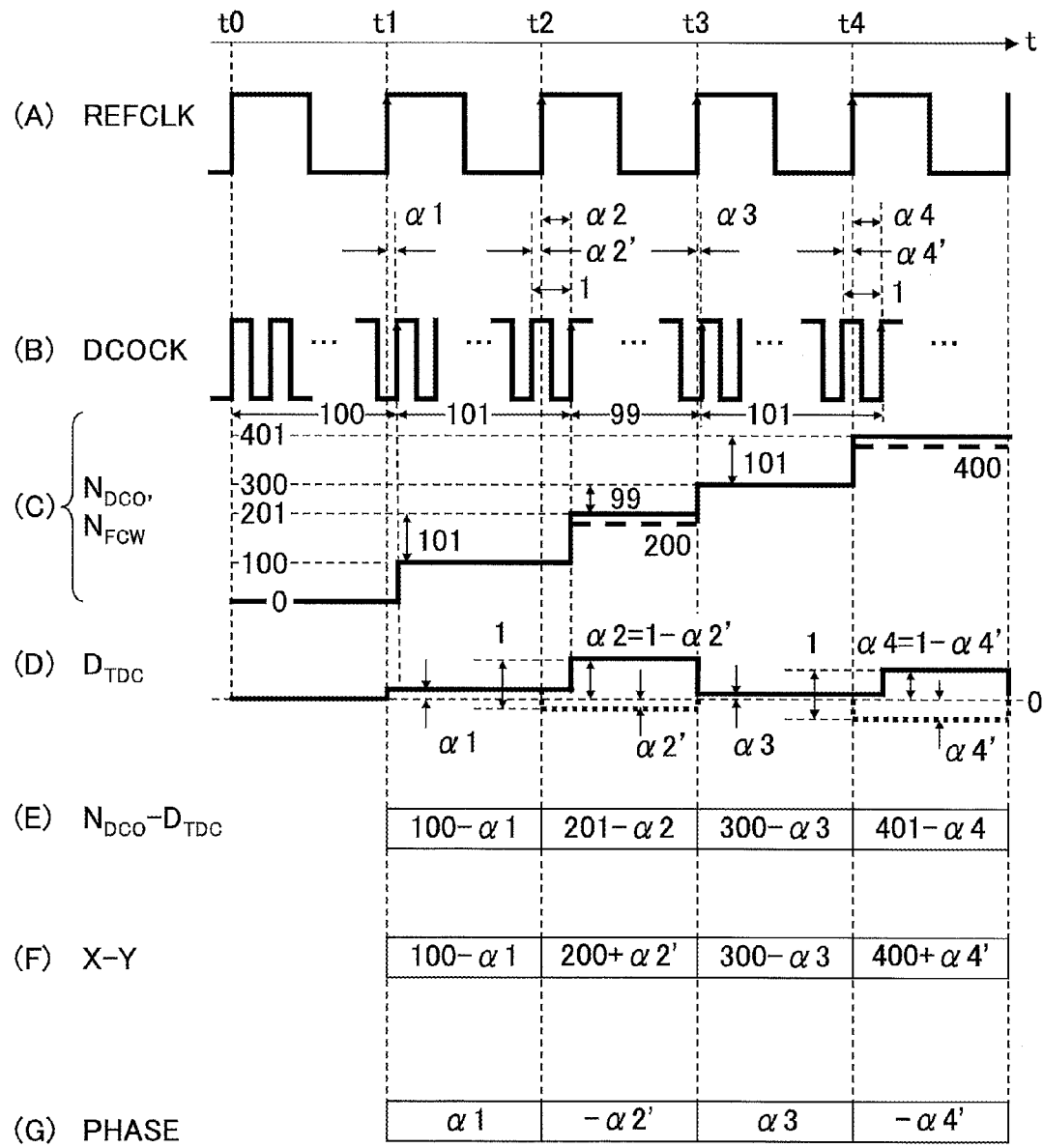
FIG. 2 is a timing chart illustrating operations of the ADPLL 300 of the comparative example.

Next, a description is given, with reference to FIG. 2, of operations of the ADPLL 300 of the comparative example when the multiplication number is set at 100.

FIG. 2 is a timing chart illustrating the operations of the ADPLL 300 of the comparative example.

In FIG. 2, (A) indicates the reference clock REFCLK. Further, (B) indicates the clock of DCOCK. In (C), a solid line represents the counted number $N_{DCO}$ of the DCOCK counter 2A, and a broken line represents the counted number $N_{FCW}$ of the FCW counter 2B. The part where the counted number $N_{FCW}$ is equal to the counted number $N_{DCO}$ is indicated by the solid line alone. Further, the counted number $N_{DCO}$ of the DCOCK counter 2A indicates a value at a time where the retiming signal RETIMING is supplied to the DCOCK counter 2A.

(D) in FIG. 2 indicates a delayed amount $D_{TDC}$ represented by a delayed signal output by the TDC 3. (E) in FIG. 2 indicates a value obtained by subtracting the delayed amount $D_{TDC}$ from the counted number $N_{DCO}$. (F) of FIG. 2 indicates a value obtained by subtracting an error Y between an expected value X of the counted number $N_{DCO}$ and the reference clock REFCLK from the expected value X of the counted number $N_{DCO}$.

Note that the expected value X of the counted number $N_{DCO}$ is incremented by 100 every time the reference clock REFCLK rises, which is computed by multiplying the number of periods of the reference clock REFCLK by 100. Note that the number of periods N is an integer of one or more.

Further, the error between the expected value X and the reference clock REFCLK is obtained by subtracting a width of the reference clock REFCLK for the N periods from a width of the clock of DCOCK for the X expected values.

(G) of FIG. 2 indicates a phase error signal PHASE output from the adder 2C in each period of the reference clock REFCLK.

It is assumed that the clock of DCOCK output by the DCO 1 is acquired as indicated by (B) of FIG. 2 with respect to the reference clock REFCLK indicated by (A) of FIG. 2.

The DCOCK counter 2A outputs the counted number $N_{DCO}$ every time the DCOCK counter 2A receives the retiming signal RETIMING. That is, the DCOCK counter 2A outputs the counted number (i.e., the number of clocks) counted up until one clock before the first clock after the rise of the reference clock REFCLK, every time the DCOCK counter 2A receives the retiming signal RETIMING.

As illustrated in (B) of FIG. 2, the DCOCK counter 2A starts counting at time t0, and at time t1, the timing at the end of $100^{th}$ clock is delayed by a phase α1 with respect to a rise of the reference clock REFCLK.

In the above condition, the counted number $N_{DCO}$ of the DCOCK counter 2A and the counted number $N_{FCW}$ of the FCW counter 2B are both 100 at a rise of the first clock of DCOCK after time t1 as illustrated in (C) of FIG. 2.

Then, a delayed amount $D_{TDC}$ represented by a delayed signal output by the TDC 3 is a1 as illustrated in (D) of FIG. 2. The delayed amount a1 represents the amount of delay from a rise of the reference clock REFCLK at time t1 to a rise of the first clock of DCOCK after the rise of the reference clock REFCLK at time t1.

Hence, a value obtained by subtracting a delayed amount $D_{TDC}$ from the counted number $N_{DCO}$ is represented by 100−α1; as illustrated in (E) of FIG. 2. Further, a value obtained by subtracting an error Y (α1) between the expected value X and the reference clock REFCLK from the expected value X (100) of the counted number $N_{DCO}$ is represented by 100−α1 as illustrated in (F) of FIG. 2.

As a result, the phase error signal PHASE output from the adder 2C is α1 as illustrated in (G) of FIG. 2.

Subsequently, at time t2, a timing at the end of the 200$^{th}$ clock of DCOCK is advanced by α2' with respect to a rise of the reference clock REFCLK as illustrated in (A) and (B) of FIG. 2.

In the above condition, the counted number $N_{DCO}$ of the DCOCK counter 2A is 201 and the counted number $N_{FCW}$ of the FCW counter 2B is 200 at a rise of the first clock of DCOCK after time t2 as illustrated in (C) of FIG. 2.

That is, the DCOCK counter 2A has counted 101 clocks of DCOCK between time t1 and time t2.

Then, a delayed amount $D_{TDC}$ represented by a delayed signal output by the TDC 3 is α2 as illustrated in (D) of FIG. 2. The delayed amount α2 represents the amount of delay from a rise of the reference clock REFCLK at time t2 to a rise of the first clock of DCOCK after the rise of the reference clock REFCLK at time t2.

Hence, a value obtained by subtracting a delayed amount $D_{TDC}$ from the counted number $N_{DCO}$ is represented by 201−α2 as illustrated in (E) of FIG. 2. Further, a value obtained by subtracting an error Y (−α2') between the expected value X and the reference clock REFCLK from the expected value X (200) of the counted number $N_{DCO}$ is represented by 200+α2' as illustrated in (F) of FIG. 2.

Note that as illustrated in (D) of FIG. 2, α2=1−α2' is established in the delayed amount $D_{TDC}$ (α2) represented by a delayed signal output by the TDC 3. Hence, a value (201−α2) obtained by subtracting the delayed amount $D_{TDC}$ from the counted number $N_{DCO}$ is equal to a value (200+α2') obtained by subtracting the error Y (−α2') between the expected value X and the reference clock REFCLK from the expected value X (200) of the counted number $N_{DCO}$.

Then, as illustrated in (G) of FIG. 2, −α2' is computed as a phase error signal PHASE output from the adder 2C by adding a delayed amount DTDC (α2=1−α2') represented by a delayed signal output by the TDC 3 to a value obtained by subtracting the counted number $N_{DCO}$ (201) from the counted number $N_{FCW}$ (200).

The TDC 3 outputs as a delayed amount $D_{TDC}$ a phase difference between a rise of the reference clock REFCLK and a rise of the first clock of DCOCK after the rise of the reference clock REFCLK. The delayed amount $D_{TDC}$ is the amount of delay in a positive time axis direction.

The TDC 3 is able to detect the amount of delay in the positive time axis direction but is not able to detect a phase difference in a negative time axis direction. That is, the TDC 3 is not able to detect a phase difference between the reference clock REFCLK and the clock of DCOCK that has risen before the rise of the reference clock REFCLK.

Hence, as described above, when there is a rise of the 200$^{th}$ clock of DCOCK desired to be detected before the rise of the reference clock REFCLK, the TDC 3 detects a delayed amount α2, which is a phase difference between the rise of the 201th clock of DCOCK and the rise of the reference clock REFCLK.

Then, the ADPLL 300 computes the phase error signal PHASE (−α2') using the delayed amount α2.

Subsequently, at time t3, a timing at the end of the 300$^{th}$ clock of DCOCK is delayed by α2 with respect to a rise of the reference clock REFCLK as illustrated in (A) and (B) of FIG. 2.

In the above condition, the counted number $N_{DCO}$ of the DCOCK counter 2A is 300 and the counted number $N_{FCW}$ of the FCW counter 2B is 300 at a rise of the first clock of DCOCK after time t3 as illustrated in (C) of FIG. 2.

That is, the DCOCK counter 2A has counted 99 clocks of DCOCK between time t2 and time t3.

Then, a delayed amount $D_{TDC}$ represented by a delayed signal output by the TDC 3 is α3 as illustrated in (D) of FIG. 2. The delayed amount α3 represents the amount of delay from a rise of the reference clock REFCLK at time t3 to a rise of the first clock of DCOCK after the rise of the reference clock REFCLK at time t3.

Hence, a value obtained by subtracting a delayed amount $D_{TDC}$ from the counted number $N_{DCO}$ is represented by 300−α3 as illustrated in (E) of FIG. 2. Further, a value obtained by subtracting an error Y (α3) between the expected value X and the reference clock REFCLK from the expected value X (300) of the counted number $N_{DCO}$ is represented by 300−α3 as illustrated in (F) of FIG. 2.

As a result, the phase error signal PHASE output from the adder 2C is α3 as illustrated in (G) of FIG. 2.

Subsequently, at time t4, a timing at the end of the 400$^{th}$ clock of DCOCK is advanced by α4' with respect to a rise of the reference clock REFCLK as illustrated in (A) and (B) of FIG. 2.

In the above condition, the counted number $N_{DCO}$ of the DCOCK counter 2A is 401 and the counted number $N_{FCW}$ of the FCW counter 2B is 400 at a rise of the first clock of DCOCK after time t4 as illustrated in (C) of FIG. 2.

That is, the DCOCK counter 2A has counted 101 clocks of DCOCK between time t3 and time t4.

Then, a delayed amount $D_{TDC}$ represented by a delayed signal output by the TDC 3 is α4 as illustrated in (D) of FIG. 2. The delayed amount α4 represents the amount of delay from a rise of the reference clock REFCLK at time t4 to a rise of the first clock of DCOCK after the rise of the reference clock REFCLK at time t4.

Hence, a value obtained by subtracting a represented by 401−α4 as illustrated in (E) of FIG. 2. Further, a value obtained by subtracting an error Y (−α4') between the expected value X and the reference clock REFCLK from the expected value X (400) of the counted number $N_{DCO}$ is represented by 400+α4' as illustrated in (F) of FIG. 2.

Note that as illustrated in (D) of FIG. 2, α4=1−α4' is established in the delayed amount $D_{TDC}$ (α4) represented by a delayed signal output by the TDC 3. Hence, a value (401−α4) obtained by subtracting the delayed amount $D_{TDC}$ from the counted number $N_{DCO}$ is equal to a value (400+α4') obtained by subtracting the error Y (−α4') between the expected value X and the reference clock REFCLK from the expected value X (400) of the counted number $N_{DCO}$.

Then, as illustrated in (G) of FIG. 2, −α4' is computed as a phase error signal PHASE output from the adder 2C by adding a delayed amount DTDC (α4=1−α4') represented by a delayed signal output by the TDC 3 to a value obtained by subtracting the counted number $N_{DCO}$ (401) from the counted number $N_{FCW}$ (400).

As described above, the ADPLL 300 of the comparative example is not able to accurately compute a final phase error signal PHASE based on the delayed amount $D_{TDC}$ detected by the TDC 3 alone.

Accordingly, in the ADPLL 300 of the comparative example, the accurate phase error signal PHASE is computed by using the counted number $N_{DCO}$ and the counted number $N_{FCW}$.

Next, a detailed description will be given, with reference to FIG. 3, of the TDC 3 of the ADPLL 300 of the comparative example.

Figure 3:
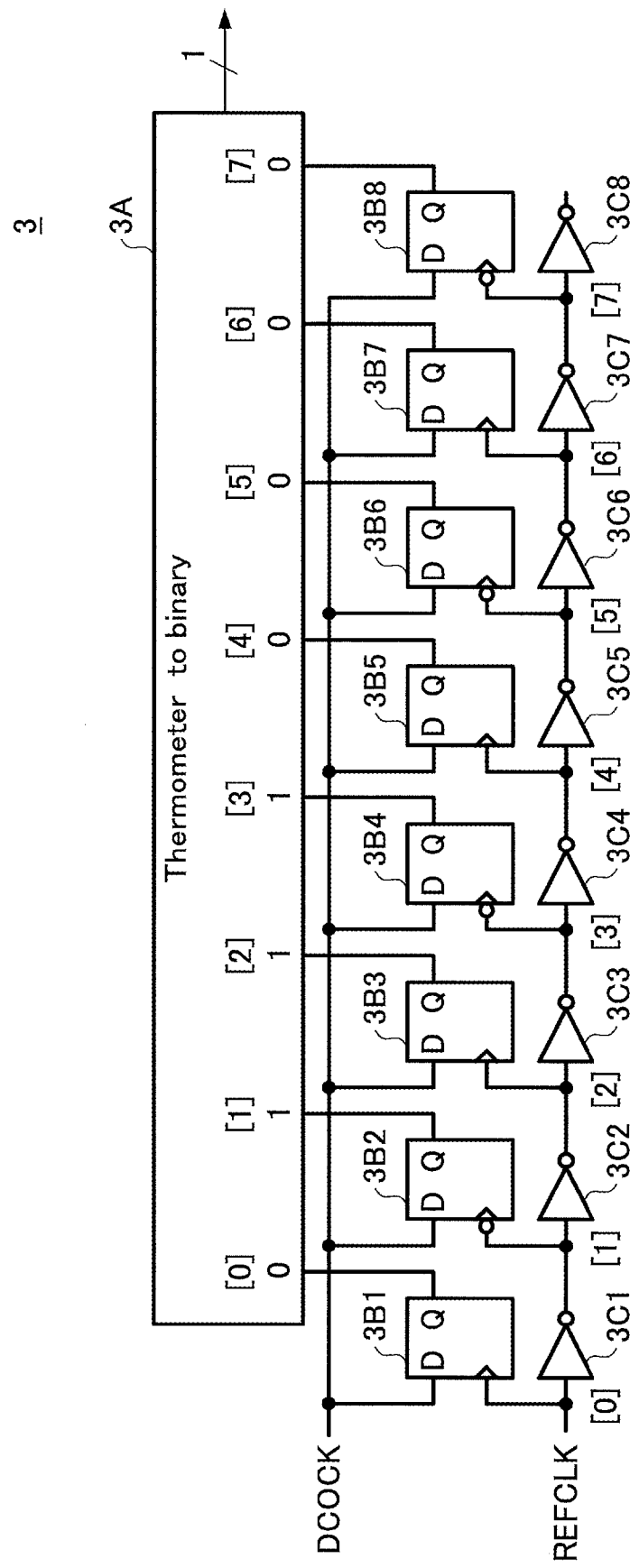
FIG. 3 is a diagram illustrating a circuit configuration of a TDC 3 of the ADPLL 300 of the comparative example.
Figure 4:
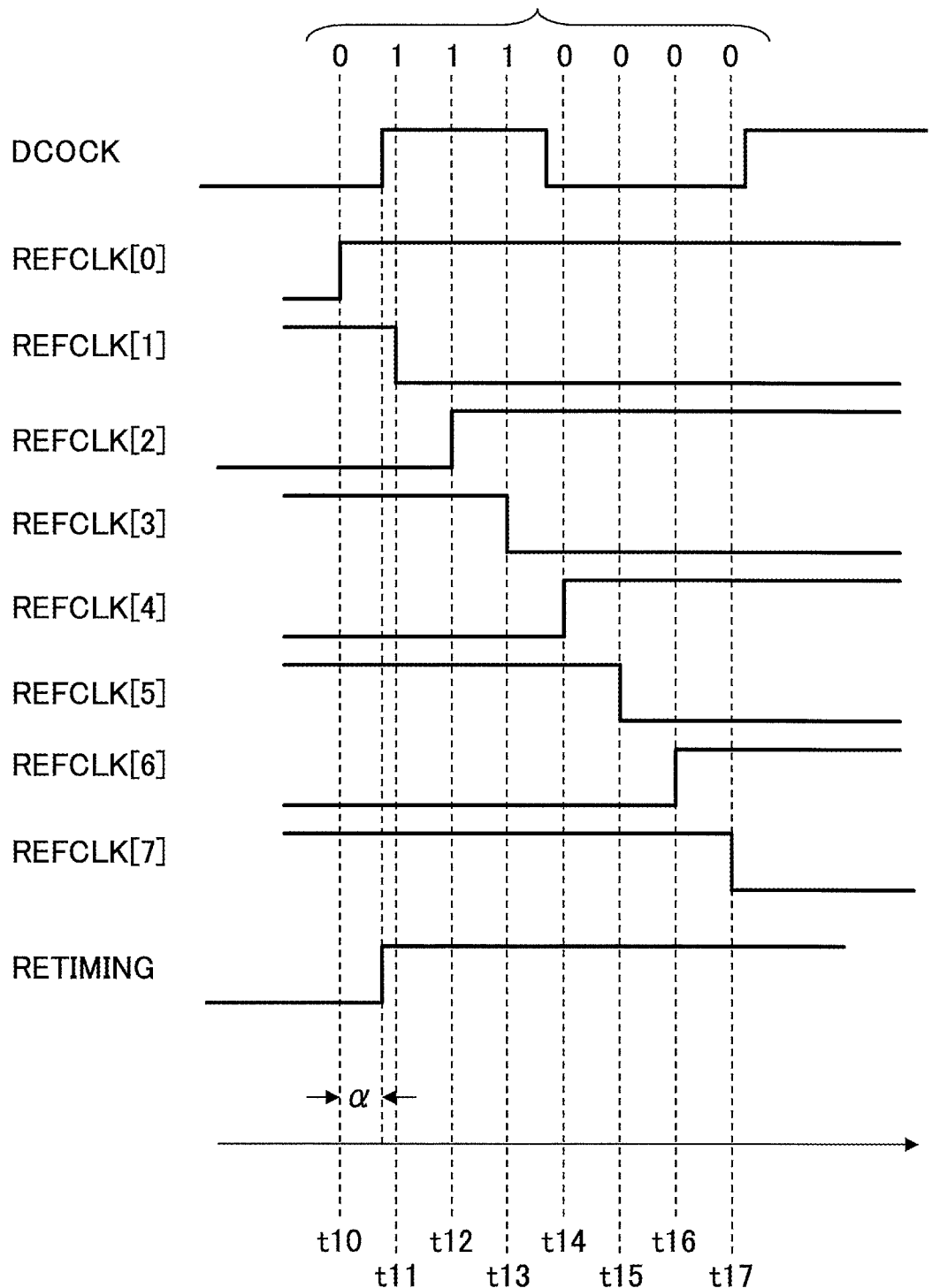
FIG. 4 is a timing chart illustrating an example of operations of the TDC 3 of the ADPLL 300 of the comparative example.

FIG. 3 is a diagram illustrating a circuit configuration of the TDC 3 of the ADPLL 300 of the comparative example. FIG. 4 is a timing chart illustrating an example of operations of the TDC 3 of the ADPLL 300 of the comparative example.

The TDC3 illustrated in FIG. 3 includes a converter 3A, D-FFs 3B1 to 3B8, and inverters 3C1 to 3C8. FIG. 3 illustrates eight stages of the D-FFs 3B1 to 3B8, and eight stages of the inverters 3C1 to 3C8 as one example; however, the number of the D-FFs and the number of the inverters are not limited to eight stages insofar as the number of the D-FFs is equal to the number of the inverters.

The converter 3A is a thermometer-to-binary converter, and the converter 3A is illustrated as an example of the thermometer-to-binary converter 3A configured to output an 8-bit thermometer code.

Respective data input terminals D of the D-FFs 3B1 to 3B8 are connected to the stop terminal (STOP) (see FIG. 1), and respective data output terminals Q are connected to an input terminal of the thermometer-to-binary converter 3A.

Further, respective inverters 3C1 to 3C8 are connected in series, respective clock input terminals of the D-FFs 3B1 to 3B8 are connected to input terminals of the inverters 3C1 to 3C8 having the subscripted numbers (1 to 8) equal to those of the D-FFs 3B1 to 3B8.

Moreover, the clock input terminal of the D-FF 3B1 and the input terminal of the inverter 3C1 are connected to the start terminal (START) (see FIG. 1), and are configured to receive reference clock REFCLK. The clock input terminals of the D-FFs 3B2 to 3B8 are connected to output terminals of the inverters 3C1 to 3C7 having the subscripted numbers one less than those of the D-FFs 3B1 to 3B8. Further, the clock input terminals of the D-FFs 3B2, 3B4, 3B6, and 3B8 include respective inverting operators configured to invert outputs of the inverters 3C1, 3C3, 3C5, and 3C7 to receive the inverted outputs of the inverters 3C1, 3C3, 3C5, and 3C7.

The reference clocks REFCLK supplied to the inverter 3C1 are propagated in the inverters 3C1 to 3C8 while being inverted. Note that the respective reference clocks supplied to the inverters 3C1 to 3C8 are identified as REFCLK [0] to REFCLK [7].

For example, the clock of DCOCK is input to the TDC 3 as illustrated in FIG. 4. In such a case, the clock of DCOCK is delayed by a phase a at the boundary where the clock of DCOCK transitions from an L level ("0") to an H level ("1"). The TDC 3 outputs the phase a as a delayed amount of a phase of the clocks of DCOCK with respect to the reference clock REFCLK.

As described above, the TDC 3 quantizes the delayed amount of the phase of the clock of DCOCK with the reference clock REFCLK to output the quantized delayed amount at the boundary where the clock of DCOCK transitions from an L level ("0") to an H level ("1"). The TD3 uses delayed times of the inverters 3C1 to 3C8 to output the delayed amount.

Since the TDC 3 uses the delayed times of the inverters 3C1 to 3C8, resolution of the TDC 3 is limited by the delayed times of the inverters. That is, the TDC 3 is unable to detect the delayed amount less than the delayed times of the inverters 3C1 to 3C8. An example of the delayed time of the inverter may be approximately 5 ps (pico seconds) at a minimum.

Thus, the resolution of the ADPLL 300 of the comparative example is limited, which may cause the ADPLL 300 to insufficiently handle a high frequency of the clock of DCOCK.

Further, in-band phase noise of the ADPLL 300 is determined based on the resolution of the TDC 3, which governs jitter included in the output of the ADPLL 300.

Hence, the ADPLL 300 of the comparative example is not always able to sufficiently lower the in-band phase noise.

As described above, the ADPLL 300 of the comparative example has exhibited the limitation of the resolution, and difficulty in sufficiently lowering the in-band phase noise.

In the following, a description is given of an ADPLL that may overcome the above-described limitations of the ADPLL of the comparative example.

First Embodiment

FIG. 5A is a perspective diagram illustrating a mobile phone terminal 500 including an ADPLL 100 of a first embodiment, and FIG. 5B is a diagram illustrating a substrate 504 included in the mobile phone terminal 500.

As illustrated in FIG. 5A, a display part 502, and an operations part 503 are disposed on an outer surface of a housing 501 of the mobile phone terminal 500, and the substrate 504 indicated by a broken line is disposed inside the housing 501.

Note that the mobile phone terminal 500 is an example of an electronic apparatus, and the substrate 504 is an example of a circuit board.

The housing 501 may be made of resin or metal, and includes respective opening parts for disposing the display part 502 and the operations part 503. The display part 502 may be any liquid crystal panel capable of displaying characters, numeric values, images, and the like. Further, the operations panel 503 includes, in addition to a numeric keypad, various selection keys for selecting functions of the mobile phone terminal 500. Note that the mobile phone terminal 500 may include a proximity communication device (e.g., an infrared communication device, a communication device for electronic money, etc.) or an accessory such as a camera.

Further, the substrate 504 illustrated in FIG. 5B may, for example, be an FR 4 (Flame retardant type 4), glass cloth-based epoxy resin substrate, on a surface of which copper foil is patterned, thereby forming wiring parts 505. The wiring parts 505 serve as communication paths of various signals necessary for driving an electronic apparatus. The wiring parts 505 may, for example, be patterned by an etching process utilizing resist.

Note that FIG. 5B illustrates the wiring parts 505 that are formed on a surface 504A of the substrate 504. The substrate 504 is a layered substrate that includes plural wiring parts 505. The substrate 504 includes a power wiring part in an inner layer of the substrate 504.

An antenna 511, an RF communications part 512, a base-band processor 513, and a CPU (central processing unit) chip 514 are mounted on the substrate 504. The antenna 511, the RF communications part 512, the base-band processor 513, and the CPU chip 514 are necessary for performing communications such as calls with the mobile phone terminal 500. The RF communications part 512 includes a DA (digital to analog) converter.

The antenna 511, the RF communications part 512, the base-band processor 513, and the CPU chip 514 may, for example, be mounted on the substrate 504 by being connected with soldering balls to the wiring parts 505.

The ADPLL 100 of the first embodiment may, for example, be included in the RF communications part 512.

In a case of transmitting data, a signal such as an audio signal processed by the CPU chip 514 is base-band processed by the base-band processor 513, the base-band processed signal is then converted into an analog signal while being amplified and filtered, and the converted signal is output from the antenna 11.

The FR4 substrate used as the substrate 504 generally includes a layered structure formed of plural insulating layers and copper foil. The copper foil is patterned between the adjacent layers, an uppermost surface of the layered structure, and a lowermost surface of the layered structure.

Further, the substrate 504 may be any dielectric substrate other than the FR4 substrate insofar as the wiring parts 505 may be formed and circuits may be formed on the dielectric substrate 504.

Further, the wiring parts 505 may be made of metal (e.g., aluminum (Al)) other than copper (Cu) insofar as the metal exhibits low power loss and high electric conductivity.

Note that FIG. 5A illustrates the mobile phone terminal 500 as an example of an electronic apparatus. However, the electronic apparatus is not limited to the mobile phone terminal 500 and may be any apparatus such as a smartphone terminal, a tuner for terrestrial digital television broadcasting, and the like that is configured to perform communications. The electronic apparatus may be a PC (personal computer), a server, or the like.

Figure 6:
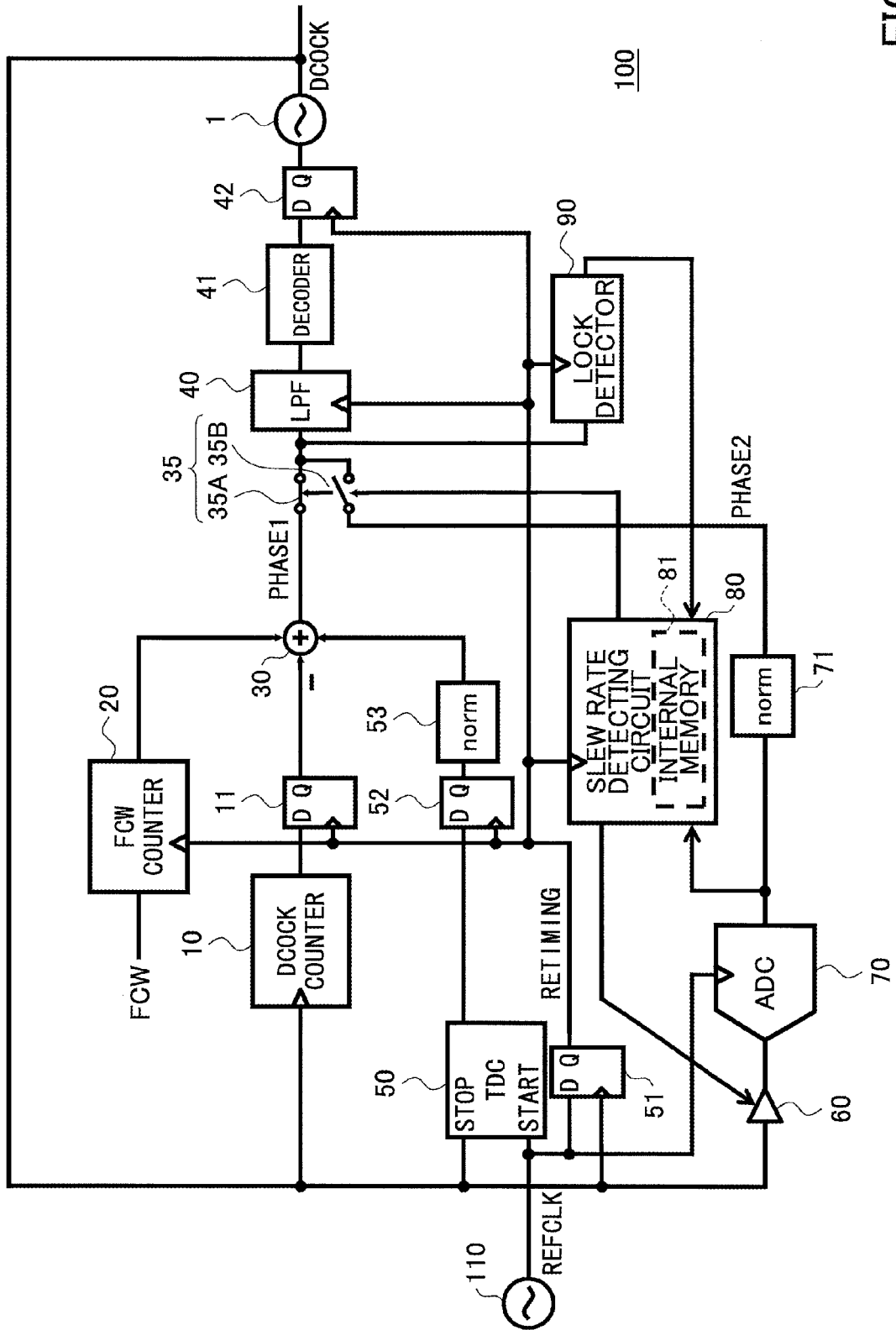
FIG. 6 is a block diagram illustrating a configuration of the ADPLL 100 of the first embodiment.

Next, a description is given, with reference to FIG. 6, of the ADPLL 100 of the first embodiment.

FIG. 6 is a block diagram illustrating a configuration of the ADPLL 100 of the first embodiment.

The ADPLL 100 of the first embodiment includes a DCO 1, a DCOCK counter 10, an FCW counter 20, an adder 30, a switching part 35, an LPF 40, a TDC 50, a slew rate adjusting buffer 60, an ADC (analog to digital converter) 70, a slew rate detecting circuit 80, and a lock detector 90 as main components.

The ADPLL 100 further includes D-FFs 11, 42, 51 and 52, a decoder 41, and normalize parts 53 and 71.

The components of the ADPLL 100 excluding the DCO 1, the TDC 50, the slew rate adjusting buffer 60, and the ADC 70 are digital circuits that are implemented by large-scale semiconductor integrated circuits (LSI).

The DCO 1 is a digitally controlled oscillator similar to the DCO 1 of the ADPLL 300 of the comparative example (see FIG. 1). The DCO 1 is connected to an output side of the LPF 40 via the decoder 41 and D-FF 42, and is configured to receive a control voltage output from the LPF 40. The DCO 1 is configured to output a clock of DCOCK, a phase of which is controlled based on the control voltage received from the LPF 40.

In FIG. 6, the output of the DCO 1 is depicted as one line. However, the clock of DCOCK output by the DCO 1 is actually a differential clock. Hence, the clock of DCOCK output by the DCO 1 is supplied to the DCOCK counter 10, the FCW counter 20, the TDC 50, and the slew rate adjusting buffer 60 as a differential clock.

However, FIG. 6 depicts signal lines of the clock of DCOCK with one line for facilitating viewability.

A clock input terminal of the DCOCK counter 10 is connected to an output terminal of the DCO 1, and an output terminal of the DCOCK counter 10 is connected to a data input terminal D of the D-FF 11. The DCOCK counter 10 is an example of a first counter.

The clock of DCOCK of the DCO 1 is fed back to and input into the DCOCK counter 10. The DCOCK counter 10 counts the clocks of DCOCK that are input from the DCO 1, and supplies data representing a counted number (i.e., a counted number of clocks) into the data input terminal D of the D-FF 11.

The data input terminal D of the D-FF 11 is connected to the output terminal of the DCOCK counter 10, a data output terminal Q of the D-FF 11 is connected to an input terminal of the adder 30, and a clock input terminal of the D-FF 11 is connected to a data output terminal Q of the D-FF 51.

When the D-FF 11 receives a retiming signal RETIMING from the D-FF 51, the D-FF 11 reflects the counted number supplied from the DCOCK counter 10 to the data input terminal D to the data output terminal Q. Hence, the counted value of the DCOCK counter 10 is input into the adder 30. The polarity of the counted number of the clocks of DCOCK 10 is inverted into a negative sign, and the counted number with a negative sign is input into the adder 30.

The FCW counter 20 includes a setting of a multiplication number representing an FCW (frequency command word). A clock input terminal of the FCW counter 20 is connected to a data output terminal Q of the D-FF 51, and an output terminal of the FCW counter 20 is connected to an input terminal of the adder 30. The FCW counter 20 is an example of a second counter.

The FCW is a setting value representing the number of clocks of DCOCK included in one period of the reference clock REFCLK.

Note that the reference clock REFCLK is a signal serving as a reference for operations of the ADPLL 100. An example of such a reference clock REFCLK may be a highly accurate clock supplied from a quartz oscillator. Further, 100 may be set as the FCW as an example.

The FCW counter 20 counts a number of clocks by integrating the FCW every time the retiming signal RETIMING is input from the D-FF 51, and outputs the counted number into the adder 30.

The input terminal of the adder 30 is connected to the data output terminal Q of the D-FF 11, the output terminal of the FCW counter 20, the output terminal of a normalizing part 53, and the slew rate detecting circuit 80. The output terminal of the adder 30 is connected to an input terminal of a switch 35A of the switching part 35.

The adder 30 outputs a value by adding a delayed amount input from the TDC 50 via the D-FF 52 and the normalizing part 53 to a value obtained by subtracting the counted number input from the DCOCK counter 10 via the D-FF 11 from the counted number input from the FCW counter 20. The value output by the adder 30 is a phase error signal PHASE 1 representing a phase error, which is supplied to the LPF 40 via the switch 35A of the switching part 35.

Further, the adder 30 receives a fixed value from the slew rate detecting circuit 80 when a slew rate of the slew rate adjusting buffer 60 is set. The method of setting the slew rate will be described later.

The switching part 35 includes the switch 35A and a switch 35B. The input terminal of the switch 35A is connected to the output terminal of the adder 30, and the output terminal of the adder 30 is connected to the input terminal of the LPF 40. An input terminal of the switch 35B is connected to the output terminal of the ADC 70 via a normalizing part 71, and an output terminal of the switch 35B is connected to the input terminal of the LPF 40.

The switch 35A and the switch 35B of the switching part 35 are switched based on a switching signal output from the slew rate detecting circuit 80. One of the switch 35A and the switch 35B is switched on (close) and the other one is switched off (open) based on the switching signal input from the slew rate detecting circuit 80.

When the switch 35A is turned on, the output terminal of the adder 30 and the input terminal of the LPF 40 are connected. That is, the input terminal of the LPF 40 receives the phase error signal PHASE 1 including a delayed amount detected by the TDC 50.

On the other hand, when the switch 35B is turned on, the output of the ADC 70 is connected to the input terminal of the LPF 40.

The LPF 40 is a so-called loop circuit. The input terminal of the LPF 40 is connected to the respective output terminals of the switch 35A and the switch 35B of the switching part 35, and the output terminal of the LPF 40 is connected to an input terminal of the decoder 41.

When the switch 35A is turned on, the LPF 40 integrates a phase error signal PHASE 1 supplied from the adder 30, and outputs the integrated phase error signal PHASE 1 as a control voltage to control the DCO 1. The control voltage indicates a direct-current voltage. Further, when the switch 35B is turned on, the LPF 40 integrates a phase error signal PHASE 2 supplied from the ADC 70 via the normalizing part 71, and outputs the integrated phase error signal PHASE 2 as a control voltage to control the DCO 1.

When the LPF 40 receives a retiming signal RETIMING from the TDC 50, the LPF 40 outputs a control voltage to the decoder 41.

An input terminal of the decoder 41 is connected to the output terminal of the LPF 40, and an output terminal of the decoder 40 is connected to a data input terminal D of the D-FF 42. The decoder 41 decodes the control voltage supplied from the LPF 40 to convert the control signal into a control voltage of a digital data format supplied to the DCO 1.

The data input terminal D of the D-FF 42 is connected to the output terminal of the decoder 41, a data output terminal Q of the D-FF 42 is connected to an input terminal of the DCO 1, and a clock input terminal of the D-FF 42 is connected to a data output terminal Q of a D-FF 51. When the clock input terminal of the D-FF 42 receives a retiming signal RETIMING from the D-FF 51, the D-FF 42 reflects the control voltage of the digital data format input from the decoder 41 to the data input terminal D to the data output terminal Q. As a result, the control voltage of the digital data format is input from the data output terminal Q of the D-FF 42 to the DCO 1.

A start terminal (START) of the TDC 50 is connected to an output terminal of a quartz oscillator 110, a stop terminal (STOP) of the TDC 50 is connected to the output terminal of the DCO 1, and an output terminal of the TDC 50 is connected to a data input terminal D of the D-FF 52.

The start terminal (START) of the TDC 50 receives the reference clock REFCLK from the quartz oscillator 110, and the stop terminal (STOP) receives the clock of DCOCK from the DCO 1. The TDC 50 supplies to a data input terminal D of the D-FF 52 a delayed signal representing a delayed amount of a phase of the clocks of DCOCK with respect to the reference clock REFCLK.

The delayed amount output by the TDC 50 represents the amount of delay from a rise of the reference clock REFCLK to a rise of the first clock of DCOCK after the rise of the reference clock REFCLK.

A data input terminal D of the D-FF 51 is connected to the quartz oscillator 110, and a clock input terminal of the D-FF 51 is connected to the output terminal of the DCO 1. Further, a data output terminal Q of the D-FF 51 is connected to respective clock input terminals of the D-FFs 11, 42 and 52, and respective clock input terminals of the FCW counter 20, the LPF 40 and the slew rate detecting circuit 80.

When the clock input terminal D of the D-FF 51 receives the first clock of DCOCK after the data input terminal D of the D-FF 51 has received the reference clock REFCLK, the D-FF 51 outputs a retiming signal RETIMING.

A data input terminal D of the D-FF 52 is connected to the output terminal of the TDC 50, a data output terminal Q of the D-FF 52 is connected to an input terminal of the normalizing part 53, and a clock input terminal of the D-FF 52 is connected to the data output terminal Q of the D-FF 51.

When the clock input terminal of the D-FF 52 receives a retiming signal RETIMING from the D-FF 51, the D-FF 52 reflects a value of the data input terminal D to the data output terminal Q. Hence, the delayed signal output by the TDC 50 is supplied to the adder 30 via the D-FF 52 and the normalizing part 53.

An input terminal of the normalizing part 53 is connected to the data output terminal Q of the D-FF 52, and an output terminal of the normalizing part 53 is connected to the input terminal of the adder 30. The normalizing part 53 adjusts gain of the delayed signal input from the TDC 50 via the D-FF 52 to output the adjusted signal to the adder 30.

An input terminal of the slew rate adjusting buffer 60 is connected to the output terminal of the DCO 1, and an output terminal of the slew rate adjusting buffer 60 is connected to the input terminal of the ADC 70. The slew rate adjusting buffer 60 is an example of a slew rate setting part configured to set a slew rate of the clocks of DCOCK that are fed back from the DCO 1 and received by the slew rate adjusting buffer 60.

The slew rate in the slew rate adjusting buffer 60 is set by the slew rate detecting circuit 80. The setting of the slew rate in the slew rate adjusting buffer 60 is described later.

An input terminal of the ADC 70 is connected to an output terminal of the slew rate adjusting buffer 60, an output terminal of the ADC 70 is connected to the input terminal of the normalizing part 71 and the slew rate detecting circuit 80, and a clock input terminal of the ADC 70 is connected to the quartz oscillator 110.

When receiving a reference clock REFCLK from the quartz oscillator 110, the ADC 70 digitally converts the clock of DCOCK to which the slew rate is set in the slew rate adjusting buffer 60 to output a phase error signal PHASE 2.

The ADC 70 may be, for example, an eight bit ADC that is configured to quantize the clocks DCOCK to which the slew rate is set in the slew rate adjusting buffer 60 to output the phase error signal PHASE 2 representing a quantization error. An example of the ADC 70 may include an SAR (successive approximation resister) ADC. Details of the ADC 70 are described later with reference to FIG. 11.

The normalizing part 71 is configured to adjust the gain of the phase error signal PHASE 2 output from the ADC 70. The phase error signal PHASE 2, the gain of which is adjusted in the normalizing part 71, is supplied to the LPF 40 when the switch 35B is turned on.

An input terminal of the slew rate detecting circuit 80 is connected to the output terminal of the ADC 70 and the output terminal of the lock detector 90, an output terminal of the slew rate detecting circuit 80 is connected to a slew rate adjusting terminal of the slew rate adjusting buffer 60 and a control terminal of the switches 35A and 35B, and a clock input terminal of the slew rate detecting circuit 80 is connected to the data output terminal Q of the D-FF 51. Further, the slew rate detecting circuit 80 includes an internal memory 81 for holding an operation value generated during processing. The slew rate detecting circuit 80 is an example of a controller.

When the clock input terminal of the slew rate detecting circuit 80 receives a retiming signal RETIMING, the slew rate detecting circuit 80 adjusts the slew rate in the slew rate adjusting buffer 60. When the lock detector 90 detects a locked status, the slew rate detecting circuit 80 switches the switch 35A off as well as switching the switch 35B on simultaneously with receiving the retiming signal RETIMING. The process performed by the slew rate detecting circuit 80 is described later.

An input terminal of the lock detector 90 is connected to an output terminal of the switching part 35 (output terminal of the switch 35A and the switch 35B), an output terminal of the lock detector 90 is connected to the input terminal of the slew rate detecting circuit 80, and a clock input terminal of the slew rate detecting circuit 80 is connected to the data output terminal Q of the D-FF 51.

The lock detector 90 is configured to capture the phase error signal PHASE 1 on the output terminal side of the switch 35A to determine whether a phase error represented by the phase error signal PHASE 1 is a value within a predetermined range. When the lock detector 90 determines the phase error represented by the phase error signal PHASE 1 is a value that falls within a predetermined range, the lock detector 90 inputs a lock detecting signal representing detection of the lock status into the slew rate detecting circuit 80.

Initially, the ADPLL 100 of the first embodiment adjusts a phase of the clock of DCOCK utilizing the TDC 50 such that a phase of the clock of DCOCK output from the DCO 1 is equal to that of the reference clock REFCLK.

Further, the ADPLL 100 adjusts the slew rate of the clock of DCOCK in the slew rate adjusting buffer 60 while retaining the lock status utilizing the TDC 50. Next, the ADPLL 100 searches for a lock point of the ADC 70 utilizing the adjusted slew rate. When the ADPLL 100 has detected the lock point of the ADC 70, the ADPLL 100 switches the switch 35B of the switching part 35 on to connect the ADC 70 to the LPF 40.

Then, the ADPLL 100 adjusts the phase of the clock of DCOCK utilizing the ADC 70 such that the phase of the clock of DCOCK output from the DCO 1 is equal to that of the reference clock REFCLK.

The reason that the ADC 70 has resolution higher than that of the TDC 50 is described with reference to FIG. 7.

Next, illustration is given of the resolution at the lock point 70 of the ADC 70 included in the ADPLL 100 of the first embodiment.

Figure 7:
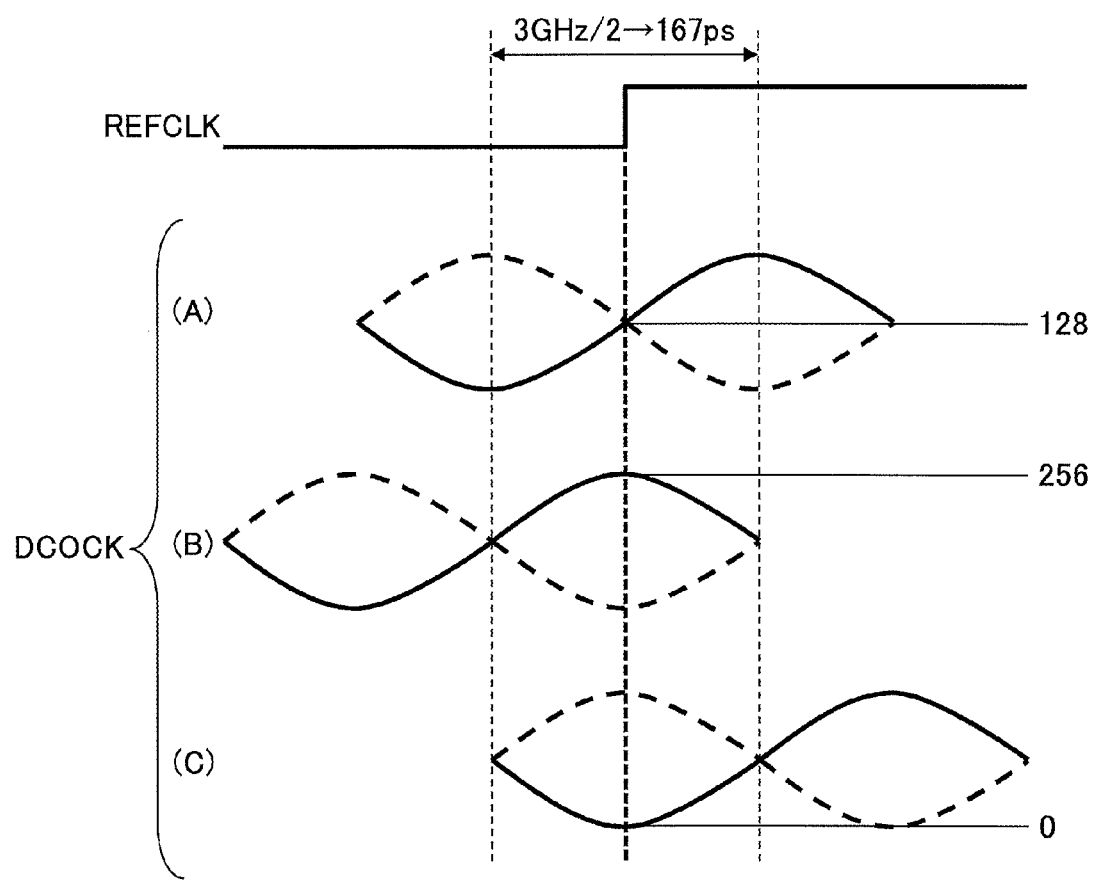
FIG. 7 is a diagram illustrating resolution of an 8-bit ADC 70 of the ADPLL 100 of the first embodiment.

FIG. 7 is a diagram illustrating the resolution of the 8-bit ADC 70 of the ADPLL 100 of the first embodiment. FIG. 7 illustrates the reference clock REFCLK, and three types of clocks of DCOCK having different phases. Since each of the clocks of DCOCK is a differential clock, a clock having a phase differing by 180 degrees ($\pi$) is indicated by a broken line.

The ADPLL 100 becomes a lock status by controlling a phase difference between the reference clock REFCLK and the clock of DCOCK supplied to the ADC 70 to be a certain value.

In FIG. 7, (A) indicates the clock of DCOCK in a locked status with respect to the reference clock REFCLK. Likewise, (B) indicates the clock of DCOCK having a phase having progressed by 90 degrees ($\pi/4$) with respect to that of the reference clock REFCLK, and (C) indicates the clock of DCOCK having a phase delayed by 90 degrees ($\pi/4$) with respect to that of the reference clock REFCLK.

In a case of (B), the phase difference may be made approach a status of (A) by reducing the frequency whereas in a case of (C), the phase difference may be made approach a status of (A) by raising the frequency.

Since the 8-bit ADC 70 may simply detect a phase difference between the reference clock REFCLK and the clocks of DCOCK between (B) and (C), a half period included between two broken lines may be divided by 256. Accordingly, when the ADPLL 100 of the first embodiment is locked by utilizing the ADC 70, resolution of approximately 0.65 ps obtained by dividing a half period (approx. 167 ps) time at 3 GHz by 256 may be acquired.

Figure 8A:
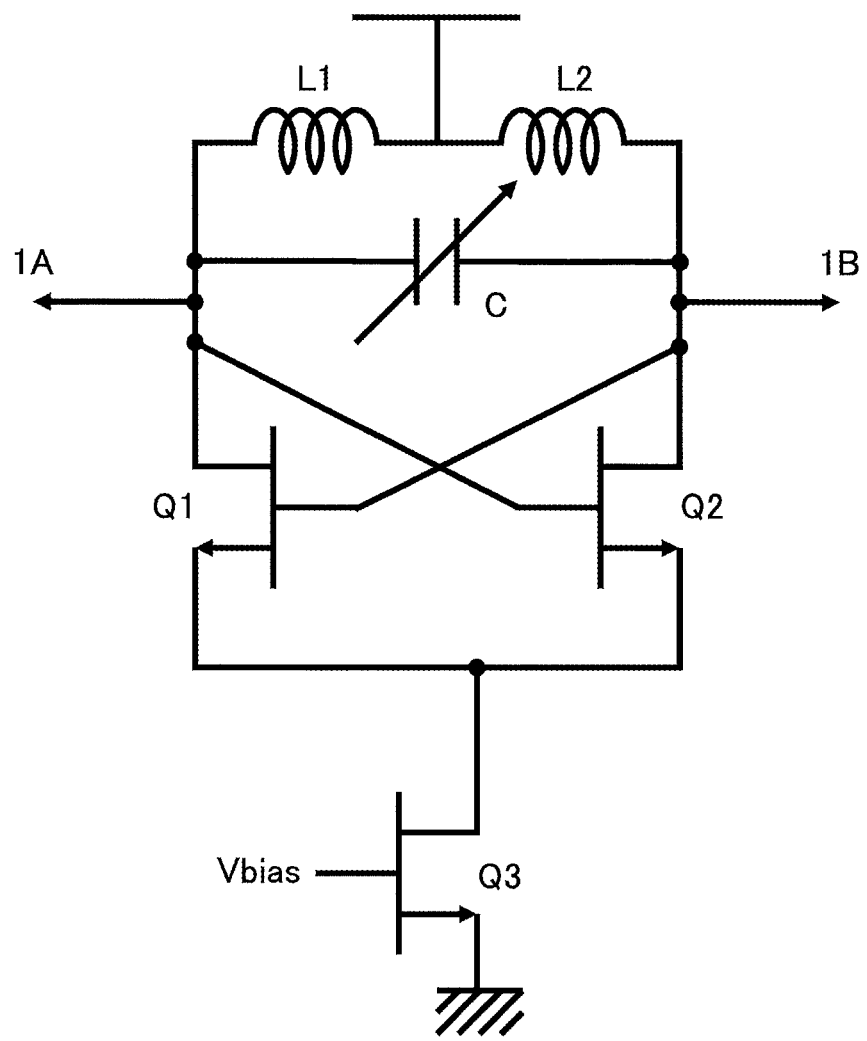
FIG. 8A is a diagram illustrating a circuit configuration of a DCO 1 of the ADPLL 100 of the first embodiment.
Figure 8B:
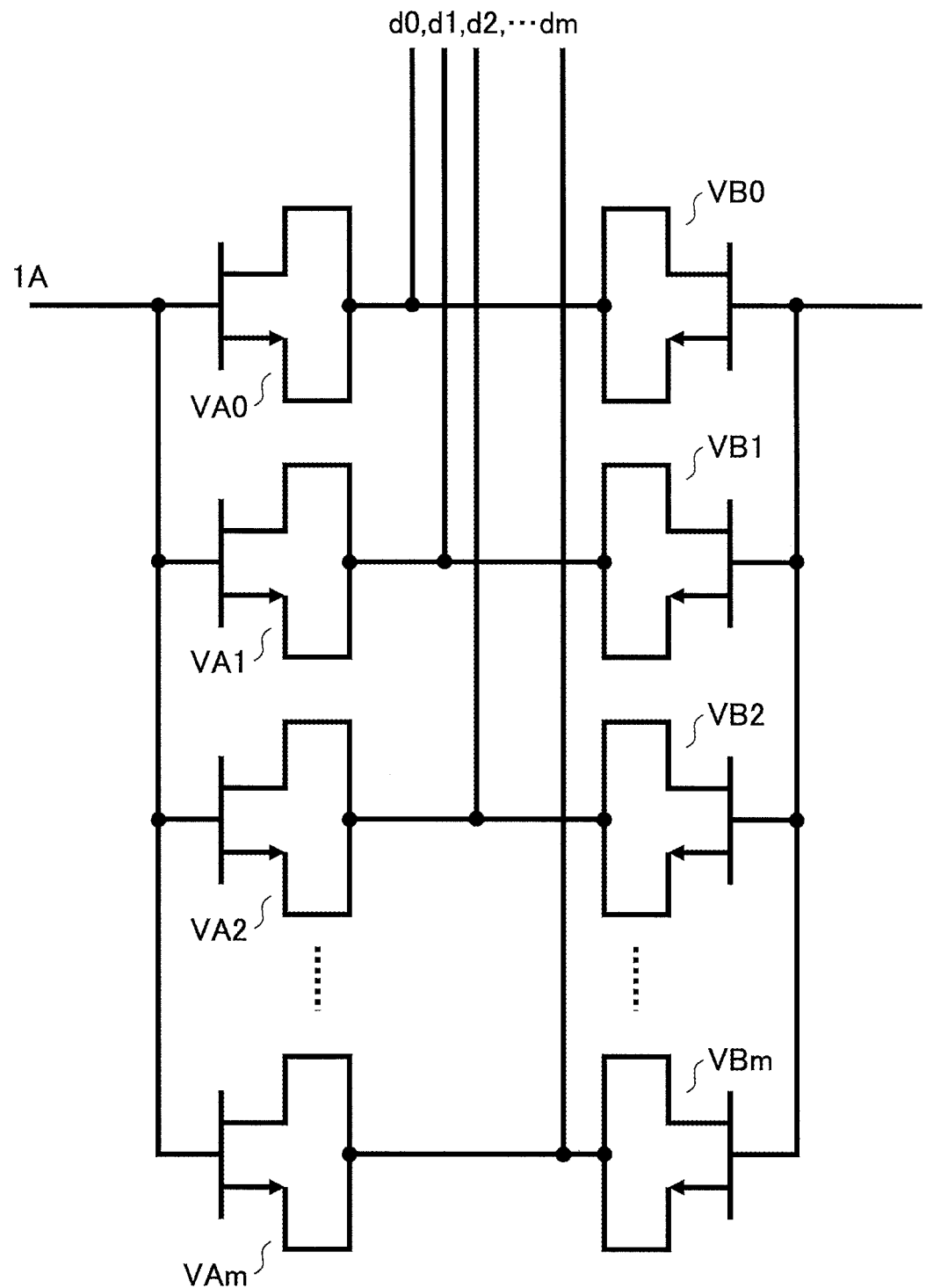
FIG. 8B is a diagram illustrating a circuit configuration of a variable capacitor included in the DCO 1 of the ADPLL 100 of the first embodiment.

Next, illustration is given of a circuit configuration of the DCO 1 with reference to FIGS. 8A and 8B.

FIG. 8A is a diagram illustrating a circuit configuration of the DCO 1 of the ADPLL 100 of the first embodiment. FIG. 8B is a diagram illustrating a circuit configuration of a variable capacitor included in the DCO 1 of the ADPLL 100 of the first embodiment.

The DCO 1 of the ADPLL 100 of the first embodiment includes, as illustrated in FIG. 8A, coils L1 and L2, a variable capacitor C, and NMOS transistors Q1, Q2, and Q3.

The DCO 1 includes output terminals 1A and 1B for outputting differential clocks of DCOCK.

The coils L1 and L2 are connected in series, and a connection point of the coils L1 and L2 is connected to a power supply.

The coils L1 and L2 and the variable capacitor C are connected in parallel. A drain of the NMOS transistor Q1 is connected to a gate of the NMOS transistor Q2, respective first ends of the coils L1 and L2, and one end of the variable capacitor C (see the terminals on the left hand side in FIG. 8A). A source of the NMOS transistor Q1 is connected to a source of the NMOS transistor Q2, and a drain of the NMOS transistor Q3. A gate of the NMOS transistor Q1 is connected to a drain of the NMOS transistor Q2, respective second ends of the coils L1 and L2, and the other end of the variable capacitor C (see the terminals on the right hand side in FIG. 8A).

The drain of the NMOS transistor Q2 is connected to the gate of the NMOS transistor Q1, respective second ends of the coils L1 and L2, and the variable capacitor C (see the terminal on the right hand side in FIG. 8A). The source of the NMOS transistor Q2 is connected to the source of the NMOS transistor Q1, and the drain of the NMOS transistor Q3. The gate of the NMOS transistor Q2 is connected to the drain of the NMOS transistor Q1, respective first ends of the coils L1 and L2, and one end of the variable capacitor C (see the terminals on the right hand side in FIG. 8A).

The drain of the NMOS transistor Q3 is connected to the respective sources of the NMOS transistors Q1 and Q2. A source of the NMOS transistor Q3 is grounded.

As illustrated in FIG. 8B, the variable capacitor C includes a large number of varactors VA1 to VAm and VB1 to VBm that are connected in parallel.

Respective gates of the varactors VA1 to VAm are connected to the output terminal 1A, and respective gates of the varactors VB1 to VBm are connected to the output terminal 1B. A source and a drain of each of the varactors VA1 to VAm and VB1 to VBm are mutually connected, and each of the source-drain connections of the varactors VA1 to VAm and VB1 to VBm is connected to a corresponding one of the input terminals of the DCO 1.

Each of the input terminals of the DCO 1 receives from the decoder 41 a corresponding one of digital formatted control voltages d0, d1, d2, ..., dm. The varactors VA1 to VAm and the varactors VB1 to VBm having the same subscripted numbers form pairs and are switched on or off per pair.

In the DCO 1, electrostatic capacitance of the variable capacitor C is set by switching the varactors (any one of the pairs of the varactors VA1 to VAm and varactors VB1 to VBm) based on the digital formatted control voltages d0, d1, d2, ..., dm supplied from the decoder 41. The frequencies of the clocks of DCOCK output by the DCO 1 are controlled based on the electrostatic capacitance of the variable capacitor C. Note that m may represent any integer of two or above such as 256.

The oscillating frequency of the DCO 1 may be set by adjusting the electrostatic capacitance of the variable capacitor C. In the first embodiment, the oscillating frequency of the DCO 1 may be set at 3 GHz as one example.

Figure 9:
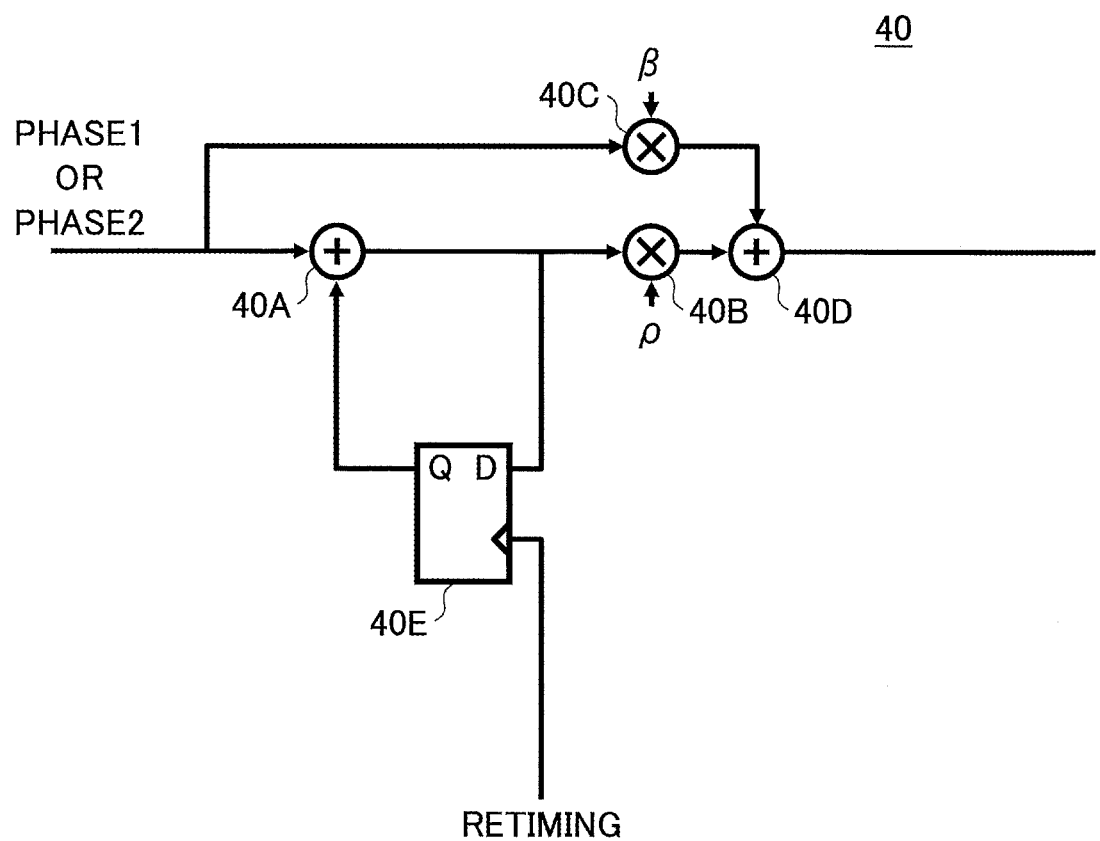
FIG. 9 is a diagram illustrating a circuit configuration of an LPF 40 of the ADPLL 100 of the first embodiment.

Next, illustration is given of the LPF 40 with reference to FIG. 9.

FIG. 9 is a diagram illustrating a circuit configuration of the LPF 40 of the ADPLL 100 of the first embodiment.

The LPF 40 includes an adder 40A, multipliers 40B and 40C, an adder 40D, and a D-FF 40E.

An input terminal of the adder 40A is connected to the output terminal of the switch 35A and the switch 35B of the switching part 35 and a data output terminal Q of the D-FF 40E, and an output terminal of the adder 40A is connected to an input terminal of the multiplier 40B and a data input terminal D of the D-FF 40E.

An input terminal of the multiplier 40B is connected to the output terminal of the adder 40A, and an output terminal of the multiplier 40B is connected to an input terminal of the adder 40D. The multiplier 40B is supplied with an integral term $\rho$. The multiplier 40B integrates an input value by the integral term $\rho$ to output the integrated value. A value of the integral term $\rho$ may be appropriately set such that the ADPLL 100 is able to stably retain a lock status.

An input terminal of the multiplier 40C is connected to the output terminal of the switch 35A and the switch 35B of the switching part 35, and an output terminal of the multiplier 40 is connected to the input terminal of the adder 40D. The multiplier 40C is connected in parallel with the adder 40A and the multiplier 40B between the switching part 35 and the adder 40D. The multiplier 40C is supplied with a proportional term $\beta$, and integrates an input value by the proportional term $\beta$ to output the integrated value.

The input terminal of the adder 40D is connected to the output terminal of the multiplier 40B and the output terminal of the multiplier 40C, and the output terminal of the adder 40D is connected to the data input terminal D of the D-FF 42. The adder 40D is configured to add an output of the multiplier 40B and an output of the multiplier 40C output the added result.

The data input terminal D of the D-FF 40E is connected to the output terminal of the adder 40A, the data output terminal Q of the D-FF 40E is connected to the input terminal of the adder 40A, and a clock input terminal of the D-FF 40E is connected to the data output terminal Q of the D-FF 51.

When the input terminal of the adder 40A is supplied with the phase error signal PHASE 1 or PHASE 2 and the output of the D-FF 40E, the LPF 40 performs integration in the multiplier 40B and proportion in the multiplier 40C to integrate the phase error signal PHASE 1 or PHASE 2. As a result, the LPF 40 outputs a control voltage.

Figure 10:
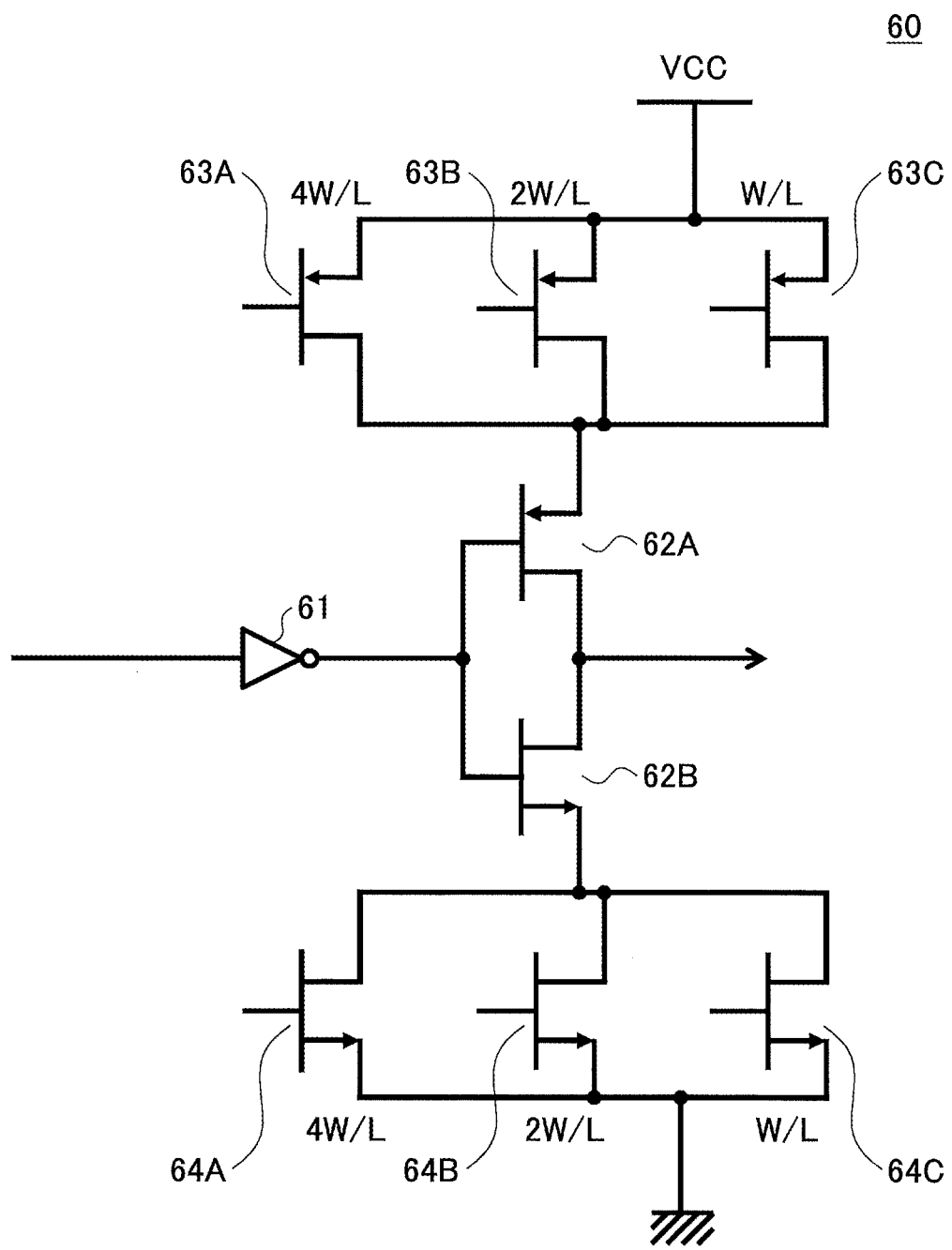
FIG. 10 is a diagram illustrating a circuit configuration of a slew rate adjusting buffer 60 of the ADPLL 100 of the first embodiment.

Next, illustration is given of a circuit configuration of the slew rate adjusting buffer 60 with reference to FIG. 10.

FIG. 10 is a diagram illustrating a circuit configuration of the slew rate adjusting buffer 60 of the ADPLL 100 of the first embodiment.

The slew rate adjusting buffer 60 includes an inverter 61, PMOS (P type metal oxide semiconductor) transistors 62A, 63A to 63C, and NMOS (N type metal oxide semiconductor) transistors 62B, 64A to 64C.

An input terminal of the invertor 61 is connected to the output terminal of the DCO 1, and an output terminal of the inverter 61 is connected to a gate of the PMOS transistor 62A and a gate of the NMOS transistor 62B.

The gate of the PMOS transistor 62A is connected to the output terminal of the inverter 61, a source of the PMOS transistor 62A is connected to drains of the PMOS transistors 63A to 63C, and a drain of the PMOS transistor 62A is connected to a drain of the NMOS transistor 62B.

The gate of the NMOS transistor 62B is connected to the output terminal of the inverter 61, a source of the NMOS transistor 62B is connected to drains of the NMOS transistors 64A to 64C, and a drain of the NMOS transistor 62B is connected to the drain of the PMOS transistor 62A.

The PMOS transistor 62A and the NMOS transistor 62B form a CMOS (complementary metal oxide semiconductor) transistor. The drain of the PMOS transistor 62A and the drain of the NMOS transistor 62B are connected to each other as described above to form an output terminal of the CMOS transistor. The drain of the PMOS transistor 62A and the drain of the NMOS transistor 62B are connected to the input terminal of the ADC 70.

The PMOS transistors 63A to 63C are connected in parallel with one another between a power supply VCC and the source of the PMOS transistor 62A. Respective sources of the PMOS transistors 63A to 63C are connected to the power supply VCC, respective drains of the PMOS transistors 63A to 63C are connected to the source of the PMOS transistor 62A, and respective gates of the PMOS transistors 63A to 63C are connected to the output terminal of the slew rate detecting circuit 80.

The PMOS transistors 63A to 63C have sizes of mutually different ratios of a channel width W and channel length L. Specifically, the respective ratios of 4 W/L, 2 W/L, and W/L are set in the sizes of the PMOS transistors 63A to 63C.

The NMOS transistors 64A to 64C are connected in parallel with one another between a ground and the source of the NMOS transistor 62B. Respective sources of the NMOS transistors 64A to 64C are grounded, respective drains of the NMOS transistors 64A to 64C are connected to the source of the NMOS transistor 62B, and respective gates of the NMOS transistors 64A to 64C are connected to the output terminal of the slew rate detecting circuit 80.

The NMOS transistors 64A to 64C have sizes of mutually different ratios of a channel width W and channel length L. Specifically, the respective ratios of 4W/L, 2W/L, and W/L are set in the sizes of the NMOS transistors 64A to 64C.

In the slew rate adjusting buffer 60, the PMOS transistor 63A and the NMOS transistor 64A are simultaneously driven by the slew rate detecting circuit 80. Similarly, the PMOS transistor 63B and the NMOS transistor 64B are simultaneously driven by the slew rate detecting circuit 80. The PMOS transistor 63C and the NMOS transistor 64C are simultaneously driven by 3-bit control voltage output from the slew rate detecting circuit 80.

The slew rate detecting circuit 80 exclusively switches the PMOS transistor 63C and the NMOS transistor 64C on to minimize the slew rate of the slew rate adjusting buffer 60. Further, the slew rate detecting circuit 80 exclusively switches the PMOS transistor 63B and the NMOS transistor 64B on to increase the slew rate by one level higher. Further, the slew rate detecting circuit 80 switches the PMOS transistors 63B and 63C, and the NMOS transistors 64B and 64C on to increase the slew rate by further one level higher than before. Moreover, the slew rate detecting circuit 80 exclusively switches the PMOS transistor 63A and the NMOS transistor 64A on to increase the slew rate by still further one level higher than before.

The slew rate detecting circuit 80 switches all the PMOS transistors 63A to 63C and the NMOS transistors 64A to 64C on to maximize the slew rate of the slew rate adjusting buffer 60.

As described above, the slew rate of the slew rate adjusting buffer 60 may be adjusted in seven levels by adjusting the 3-bit gate control voltage output from the slew rate detecting circuit 80 based on the sizes of the PMOS transistors 63A to 63C and the NMOS transistors 64A to 64C.

Figure 11:
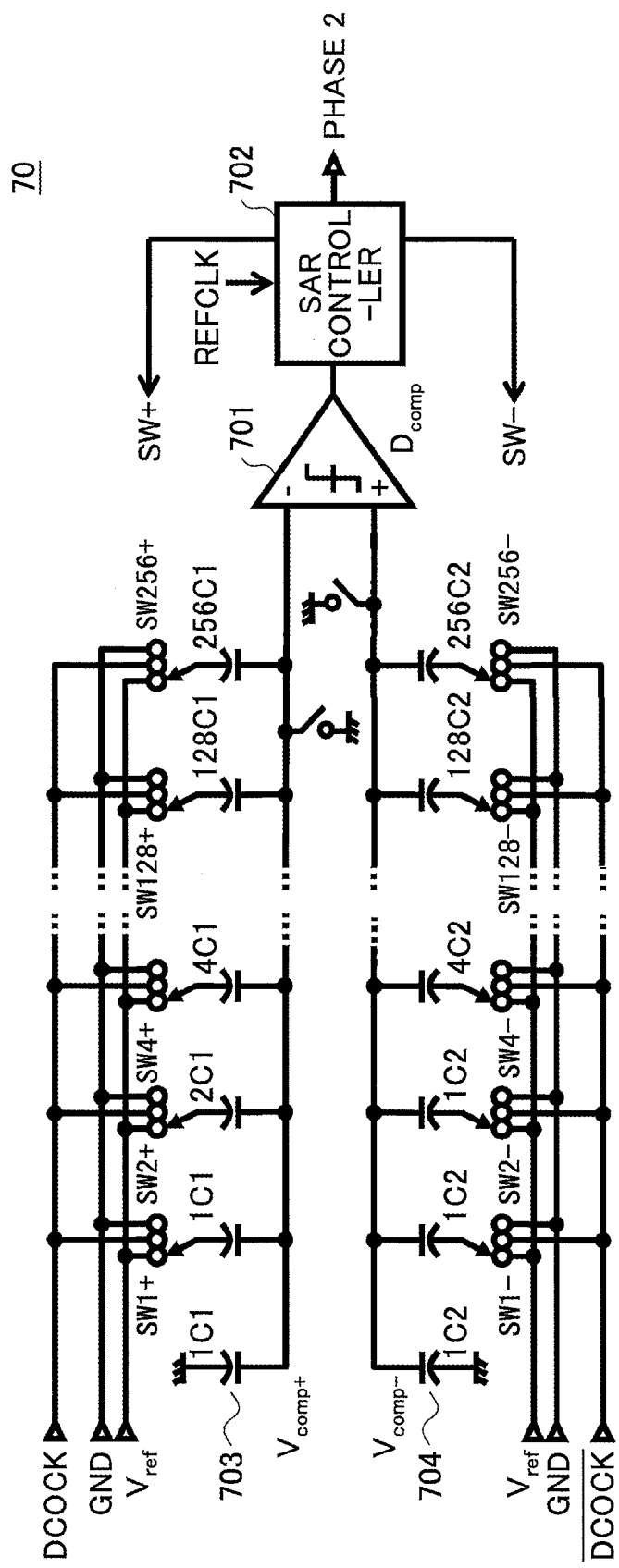
FIG. 11 is a diagram illustrating a circuit configuration of an ADC 70 of the ADPLL 100 of the first embodiment.

Next, illustration is given of the ADC 70 with reference to FIG. 11.

FIG. 11 is a diagram illustrating a circuit configuration of the ADC 70 of the ADPLL 100 of the first embodiment.

The ADC 70 of the ADPLL 100 of the first embodiment may be 8-bit SAR ADC (successive-approximation register analog-to-digital converter) as one example, and include capacitors of a group C1, capacitors of a group C2, a comparator 701, and an SAR controller 702.

The capacitors of the group C1 are assigned by binary weights, and are aligned in the order of a capacitor C1 (1C1), a capacitor C1 (1C1), two capacitors C1 (2C1), four capacitors C1 (4C1), . . . , 128 capacitors C1 (128C1), and 256 capacitors C1 (256C1) from the left to the right.

Of the group of the capacitors C1, the leftmost capacitor C1 indicated by a reference numeral 703 is a dummy. Respective first ends of the capacitors 1C1 to 256C1 excluding the leftmost capacitor C1 indicated by the reference numeral 703 are connected to switches SW1+ to SW256+, respective second ends of the capacitors 1C1 to 256C1 are connected to an inverting input terminal of the comparator 701.

The switches Sw1+ to SW256+ are three-input switches to which the clock of DCOCK, GND, and Vref are to be selectively supplied. The clock of DCOCK supplied to the switches SW1+ to SW256+ is one of the clocks of DCOCK of the differential signals. Vref may, for example, be a power supply voltage.

The capacitors of the group C1 receive the clock of DCOCK to which the slew rate is set in the slew rate adjusting buffer 60. When the SAR controller 702 sequentially switches the switches SW1+ to SW256+ to sequentially perform comparing operations, the capacitors of the group C1 output quantization errors. The output quantization errors are supplied to the inverting input terminal of the comparator 701.

Similarly, the capacitors of the group C2 are aligned in the order of a capacitor C2 (1C1), a capacitor C2 (1C2), two capacitors C2 (2C2), four capacitors C2 (4C2), . . . , 128 capacitors C2 (128C2), and 256 capacitors C2 (256C2) from the left to the right.

Of the group of the capacitors C2, the leftmost capacitor C2 indicated by a reference numeral 704 is a dummy. Respective first ends of the capacitors 1C2 to 256C2 excluding the leftmost capacitor C2 indicated by the reference numeral 704 are connected to switches SW1− to SW256−, respective second ends of the capacitors 1C2 to 256C2 are connected to a non-inverting input terminal of the comparator 701.

The switches Sw1− to SW256− are three-input switches to which a clock of DCOCK bar, GND, and Vref are to be selectively supplied. The clock of DCOCK bar is the other one of the clocks of DCOCK, and has an opposite phase of that of the clock of DCOCK supplied to the switches SW1+ to SW256+. Vref may, for example, be a power supply voltage.

The capacitors of the group C2 receive the clock of DCOCK bar to which the slew rate is set in the slew rate adjusting buffer 60. When the SAR controller 702 sequentially switches the switches SW1− to SW256− to sequentially perform comparing operations, the capacitors of the group C2 output quantization errors. The output quantization errors are supplied to the non-inverting input terminal of the comparator 701.

The output of the comparator 701 is connected to the SAR controller 702. The SAR controller 702 repeatedly performs sequential comparing operations eight times, which causes the comparator 701 to compare the quantization errors supplied from the capacitors of the group C1 to the inverting input terminal and the quantization errors supplied from the capacitors of the group C2 to the non-inverting input terminal to thereby output an 8-bit phase error signal PHASE 2.

Note that when an SAR controller ADC is used as the ADC 70, the capacitor of the SAR ADC may serve as a capacitive component for adjusting the slew rate in the slew rate adjusting buffer 60. In this case, mounting areas of slew rate adjusting buffer 60 and the ADC 70 may be reduced.

Next, illustration is given of a method of switching from the TDC 50 to the ADC 70 in the ADPLL 100 of the first embodiment.

Figure 12:
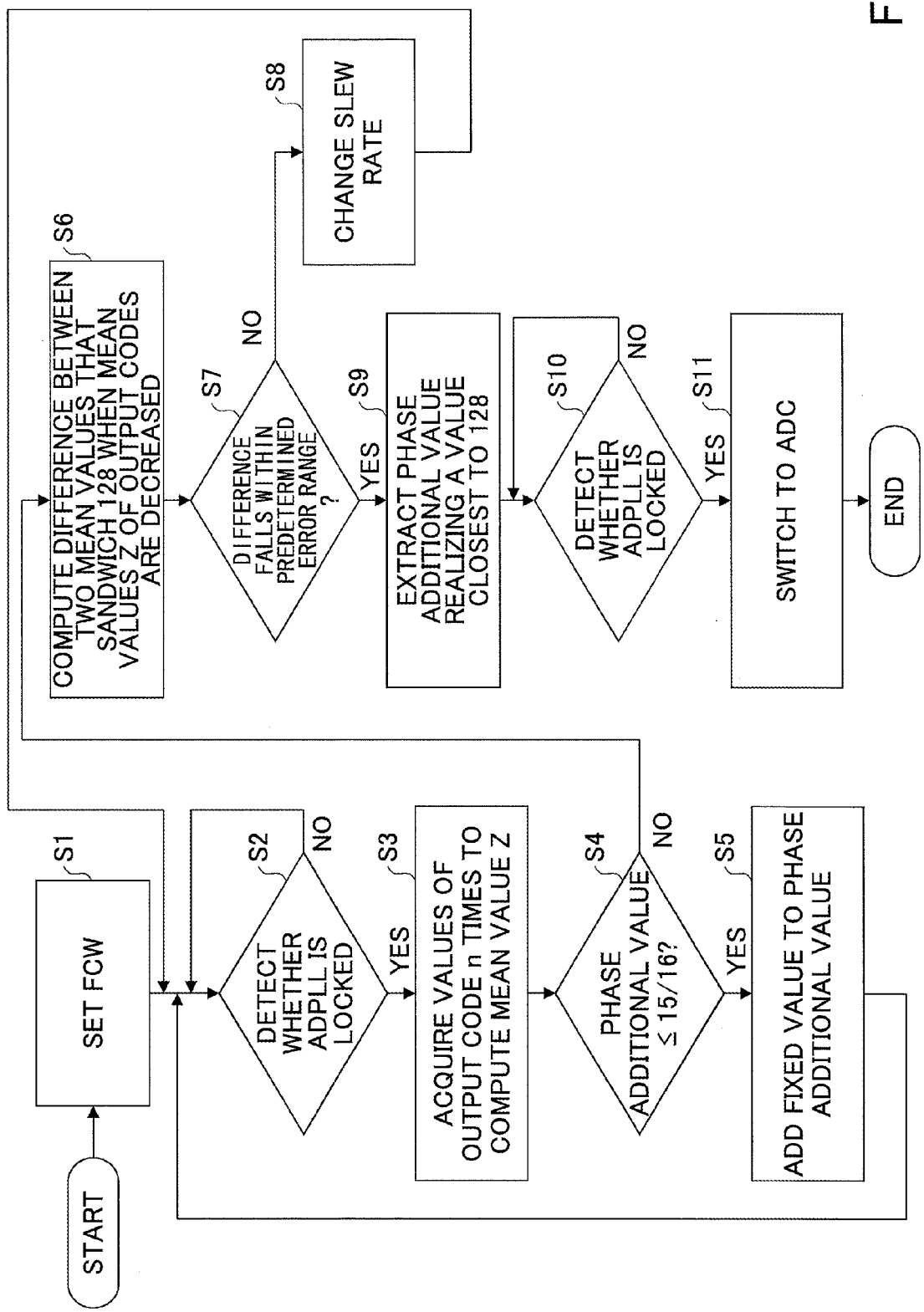
FIG. 12 is a flowchart illustrating a process of switching a TDC 50 to the ADC 70 in the ADPLL 100 of the first embodiment.

FIG. 12 is a flowchart illustrating a process of switching from the TDC 50 to the ADC 70 in the ADPLL 100 of the first embodiment. The flowchart illustrated in FIG. 12 may be implemented by the slew rate detecting circuit 80.

When the flow starts ("START" in FIG. 12), the slew rate detecting circuit 80 sets the FCW (step S1).

Subsequently, the slew rate detecting circuit 80 determines whether the ADPLL 100 utilizing the TDC 50 is locked (step S2).

Whether the ADPLL 100 is locked is determined based on whether the lock detecting signal is input from the lock detector 90 to the slew rate detecting circuit 80. The slew rate detecting circuit 80 repeatedly performs step S2 until the lock detecting signal is input from the lock detector 90 to the slew rate detecting circuit 80.

When the slew rate detecting circuit 80 determines that the slew rate detecting circuit 80 has received the lock detecting signal from the lock detector 90 ("YES" in step S2), the slew rate detecting circuit 180 acquires the output code of the ADC 70 n times to compute the mean value Z of the acquired values of the output codes of the ADC 70 (step S3).

Note that since the ADC 70 output code is 8 bits, the output code acquires any one of values of 256 phases from 0 to 255. After the TDC 50 is switched to the ADC 70 by turning off the switch 35A of the switching part 35 and turning on the switch 35B of the switching part 35, the ADPLL 100 may need to be locked. The mean value Z of the values of the output codes of the ADC 70 is thus acquired in step S3. The slew rate detecting circuit 80 stores in the internal memory 81 the mean value Z of the output code acquired in step S3.

Subsequently, the slew rate detecting circuit 80 determines whether the phase additional value output to the adder 30 is less than or equal to 15/16 (step S4).

when the slew rate detecting circuit 80 determines that the phase additional value output to the adder 30 is less than or equal to 15/16 ("YES" in step S4), the slew rate detecting circuit 80 adds a fixed value (1/16) to the phase additional value (step S5).

Note that in the ADPLL 100 of the first embodiment, a phase of the phase error signal PHASE 1 is shifted while the fixed value is added to the phase error signal PHASE 1. In the first embodiment, 1/16 of one clock period of the clock of DCOCK is used as the fixed value. The fixed value is determined as above in order to compute the mean value of the output code of the ADC 70 for one clock period of the clock of DCOCK by repeating processes in steps S2 to S5.

The fixed value may be set by a value obtained by dividing the clock of DCOCK by an appropriate number of bits. However, since the fixed value is consecutively added for searching for a lock point of the ADC 70, the fixed value may be set by the value obtained by dividing the clock of DCOCK by the number of bits less than the resolution (8 bits) of the ADC 70.

Further, the phase additional value is input by the slew rate detecting circuit 80 to the adder 30. The phase additional value is incremented by 1/16 of one clock period of the clock of DCOCK by repeatedly executing the later-described step S5. In this embodiment, the phase additional value is simply represented by 1/16, 2/16, . . . , or 16/16, each of which represents a time with respect to one period of all the clocks of DCOCK.

When steps S2 to S5 are repeatedly executed 16 times, the phase additional value is 16/16. Hence, in 16$^{th}$ step S4, the slew rate detecting circuit 80 determines that the phase additional value output to the adder 30 is not less than or equal to 15/16 ("NO" in step S4).

Subsequently, when the mean values of the output codes among the mean values Z of the output code of the ADC 70 acquired in step S3 are decreased, the slew rate detecting circuit 80 extracts two mean values Z of the output codes that sandwich 128, and computes the difference between the two mean values Z (step S6).

Figure 13:
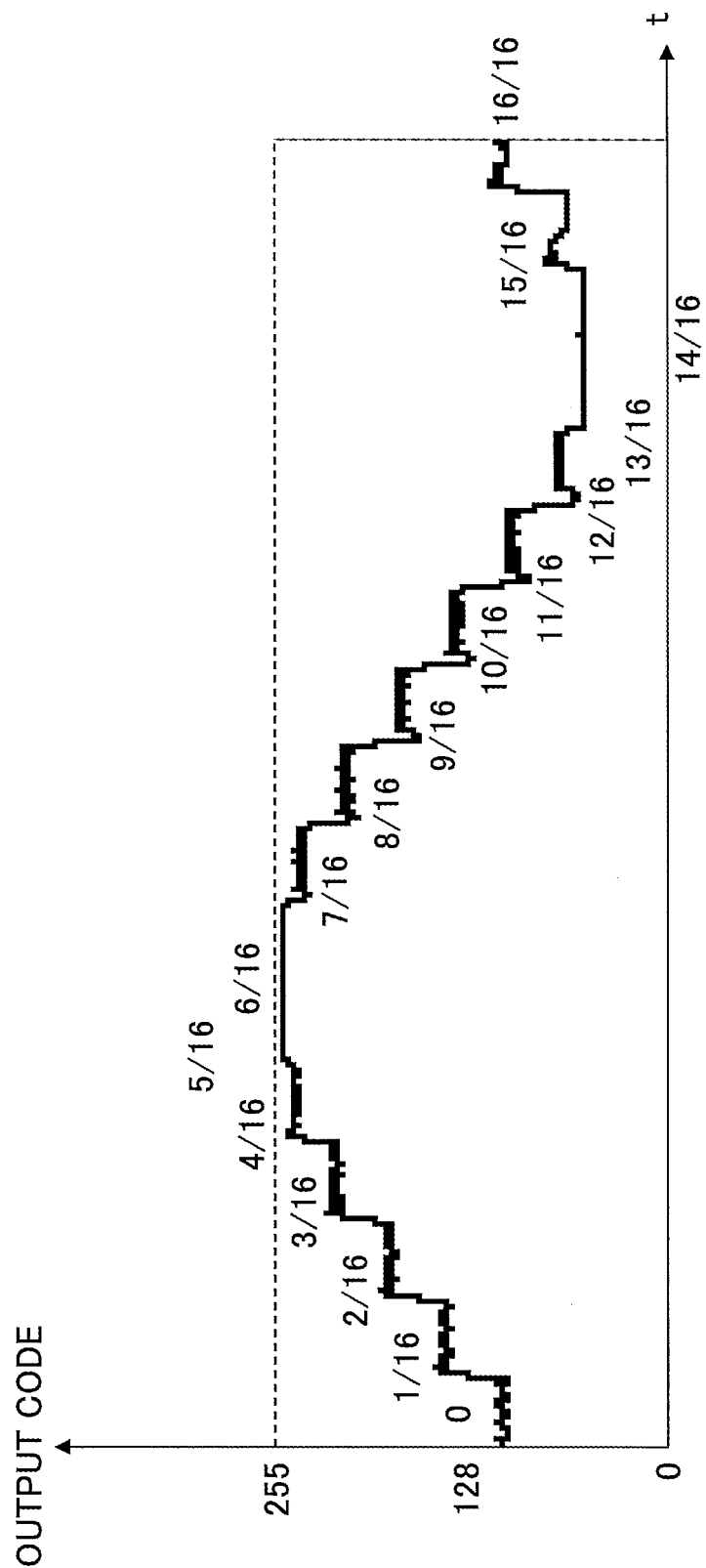
FIG. 13 is a diagram illustrating an example of a change in the mean value Z of the output code of the ADC 70 in a case where 1/16 of a phase additional value is added to each increment from 0 in the ADPLL 100 of the first embodiment.

Illustration is given, with reference to FIG. 13, of a change in the mean value Z of the output code of the ADC 70 in a case where the phase additional value is increased by 1/16 for each incremented from 0 in the ADPLL 100 of the first embodiment.

FIG. 13 is a diagram illustrating an example of a change in the mean value Z of the output code of the ADC 70 in a case where the phase additional value is added by 1/16 from 0 in the ADPLL 100 of the first embodiment.

In FIG. 13, a horizontal axis indicates a time t, a vertical axis indicates a value of the output code, and numeric values 0 to 16/16 indicate the phase additional value that is repeatedly added in step S5.

As illustrated in FIG. 13, the phase additional value is incremented by 1/16 every time steps S2 to S5 are executed. Hence, the ADPLL 100 is locked while the phase error signal PHASE 1 is incremented by 1/16.

The phase error signal PHASE 1 is obtained by adding a delayed amount input from the TDC 50 via the D-FF 52 and the normalizing part 53 to a value obtained by subtracting the counted number input from the DCOCK counter 10 via the D-FF 11 from the counted number input from the FCW counter 20. Hence, the ADPLL 100 is locked based on the delayed amount output by the TDC 50 while steps S2 to S5 are repeatedly executed.

As illustrated in FIG. 13, the mean value Z of the output code of the ADC 70 exhibits a change depicting a stepwise sine wave while the phase additional value that is increased by 1/16 for each incremented from 0 reaches 16/16. Then, when the mean value Z of the output code is decreased, the mean value Z of the output code acquires a value that approximates 128. The numeric value 128 corresponds to a code approximately in a middle of 256 codes from 0 to 255 represented by 8 bits, and is an example of an intermediate value (i.e., a median value) of all codes (0 to 255) of the output code of the 8-bit ADC 70.

Hence, in step S6 of the first embodiment, in a case where the mean value Z of the output code changes along with incrementing of the phase additional value as illustrated in FIG. 13, two mean values Z of the output codes that sandwich 128 are extracted in an interval where the mean values Z of the output codes are decreased.

For example, it may be assumed that the mean value Z of the output code of the ADC 70 is 140 when the phase additional value is 9/16, and the mean value Z of the output code of the ADC 70 is 110 when the phase additional value is 10/16.

In such a case, the slew rate detecting circuit 80 computes a value 30 that is the difference between the mean value Z (140) of the output code and the mean value Z (110) of the output code in step S6.

Step S6 ends with the above described process. Note that the above-described example illustrates a case where two output codes that sandwich 128 are extracted in an interval where the mean values Z of the output codes exhibit a decrease; however, so that the embodiment to be applied is not limited to such a case, the embodiment may be applied to a case where two output codes that sandwich 128 are extracted in an interval where the mean values Z of the output codes exhibit an increase. Accordingly, in step S6, two output codes that sandwich 128 may be extracted in an interval where the mean values Z of the output codes exhibit an increase. Whether two output codes that sandwich 128 are extracted from an interval where the mean values Z of the output codes exhibit an increase or from an interval where the mean values Z of the output codes exhibit a decrease may be determined in advance based on a connecting relationship or the like of the ADPLL 100.

Subsequently, the slew rate detecting circuit 80 compares the difference computed in step S6 and the predetermined setting value (step S7). The predetermined setting value indicates a value representing an acceptable error range. That is, in step S7, the slew rate detecting circuit 80 determines whether the difference computed in step S6 falls within the acceptable error range.

Note that the predetermined setting value may, for example, be set to 50±5. The predetermined setting value may be computed in advance in an experiment or the like utilizing the output code of the ADC 70 in a state where the ADPLL 100 is locked.

When the slew rate detecting circuit 80 determines that the difference computed in step S6 does not fall within the predetermined setting value ("NO" in step S7), the slew rate detecting circuit 80 proceeds with step S8 of the flow.

The slew rate detecting circuit 80 changes the slew rate of the slew rate adjusting buffer 60 (step S8). As a result of the comparison in step S7, when the difference computed in step S6 is less than the lower limit of the predetermined setting value, the slew rate detecting circuit 80 increases the slew rate, whereas when the difference computed in step S6 is greater than the upper limit of the predetermined setting value, the slew rate detecting circuit 80 decreases the slew rate. Note that the change of the slew rate in step S8 may indicate changing one of seven stages of the slew rate.

When the slew rate detecting circuit 80 ends the process in step S8, the slew rate detecting circuit 80 returns to step S2 of the flow. Accordingly, in step S3, the output code of the ADC 70 is acquired based on a new slew rate set in step S8, and the slew rate detecting circuit 80 repeatedly executes steps S2 to S8 until the slew rate detecting circuit 80 determines that the difference computed in step S6 falls within the predetermined setting value in step S7.

When the slew rate detecting circuit 80 determines that the difference computed in step S6 falls within the predetermined setting value ("YES" in step S7), the slew rate detecting circuit 280 proceeds with step S9 of the flow.

The slew rate detecting circuit 80 extracts the phase additional value that implements a value closest to 128 among the output codes computed in step S3 in the slew rate set in the previous step S8 (step S9).

For example, the slew rate detecting circuit 80 sets 9/16 to the phase additional value.

Subsequently, the slew rate detecting circuit 80 determines whether the ADPLL 100 utilizing the TDC 50 is locked (step S10). Step 10 is performed in order to switch from the TDC 50 to the ADC 70 while the ADPLL 100 is locked.

Whether the ADPLL 100 is locked is determined based on whether the lock detecting signal is input from the lock detector 90 to the slew rate detecting circuit 80. The slew rate detecting circuit 80 repeatedly performs step S2 until the lock detecting signal is input from the lock detector 90 to the slew rate detecting circuit 80.

When the ADPLL 100 is locked, the slew rate detecting circuit 80 turns the switch 35B of the switching part 35 on (open) while turning the switch 35A of the switching part 35 off (close) (step S11). As a result, the switching from the TDC 50 to ADC 70 is performed to thereafter end a sequence of the flow (END).

In the first embodiment, the resolution of the TDC 50 is three bits, and the resolution of the ADC 70 is eight bits. Thus, after switching from the TDC 50 to ADC 70 is performed, the ADPLL 100 may be locked by the resolution of eight bits.

The resolution is high after switching from the TDC 50 to ADC 70 is performed, so that jitter may be lowered by reducing in-band phase noise.

In the ADPLL 300 of the comparative example (see FIG. 1), the in-band phase noise governing jitter included in the ADPLL 300 is not sufficiently lowered due to the limitation of delay time of inverters 3C1 to 3C8 of the TDC 3 (see FIG. 3). The delay time of the inverters 3C1 to 3C8 included in the TDC 3 is 5 ps.

By contrast, in the ADPLL 100 of the first embodiment, an optimal value of the slew rate of the slew rate adjusting buffer 60 is computed while the locked status in the TDC 50 is maintained, and the switching from the TDC 50 to ADC 70 is performed in a state where the optimal slew rate is set.

Accordingly, after the TDC 50 is switched to a lock point of the ADC 70, the ADPLL 100 may be locked by utilizing the phase error signal PHASE 2 that outputs the ADC 70 output code having the resolution extremely higher than that of the TDC 50.

The ADC 70 output code of the ADPLL 100 of the first embodiment is eight bits. Hence, when the clock of DCOCK oscillates at 3 GHz, and a half period (approx. 167 ps) of the clock of DCOCK is divided by 256, a phase up to approximately 0.62 ps may be detected. This value is one digit smaller than 5 ps in the ADPLL 300 of the comparative example.

Thus, the ADPLL 100 according to the first embodiment may be able to significantly reduce jitter by substantially reducing the in-band phase noise.

Further, as described above, in the ADPLL 100 of the first embodiment, an optimal value of the slew rate of the slew rate adjusting buffer 60 is computed while the locked status in the TDC 50 is maintained, and the switching from the TDC 50 to ADC 70 is performed in a state where the optimal slew rate is set.

Hence, a pseudo-lock may be prevented from being generated after switching from the TDC 50 to ADC 70.

In addition, in the ADPLL 100 of the first embodiment, the DCOCK counter 10, the FCW counter 20, and the TDC 50 are not used after switching from the TDC 50 to ADC 70. Hence, the DCOCK counter 10, the FCW counter 20, and the TDC 50 may be deactivated.

Thus, according to the ADPLL 100 of the first embodiment, electric consumption may be reduced after switching from the TDC 50 to ADC 70.

Figure 14:
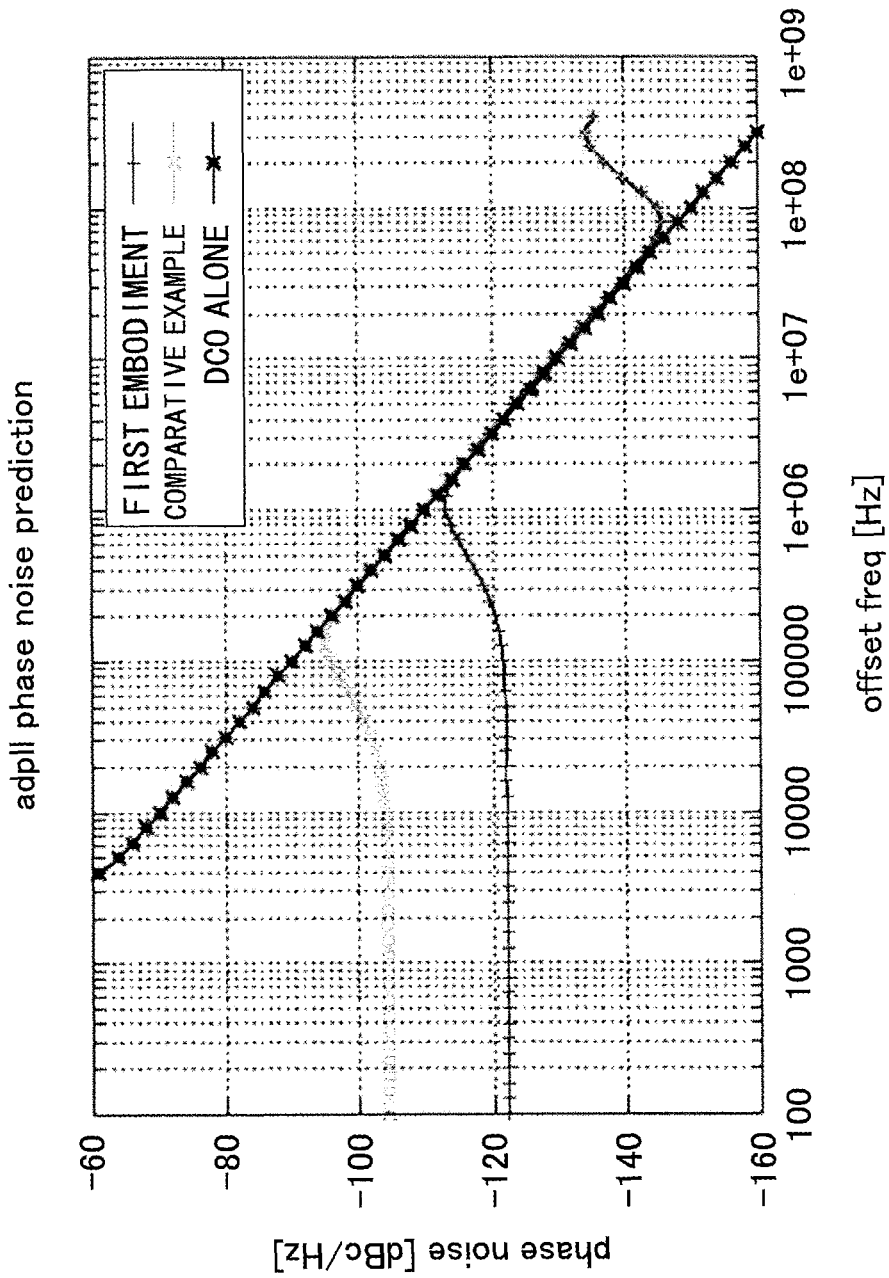
FIG. 14 is a diagram illustrating simulation results of in-band phase noise of the ADPLL 100 of the first embodiment and the ADPLL 300 of the comparative example.

FIG. 14 is a diagram illustrating simulation results of the in-band phase noise of the ADPLL 100 of the first embodiment and the ADPLL 300 of the comparative example.

In FIG. 14, a horizontal axis indicates an offset frequency, and a vertical axis indicates the in-band phase noise. Note that the offset frequency here represents an offset frequency when the clock of DCOCK is 3 GHz.

As illustrated in FIG. 14, the in-band phase noise when switched to the ADC 70 in the ADPLL 100 of the first embodiment is approximately −123 dBc/Hz in an offset frequency range of 100 Hz to approximately 100000 Hz. Further, the maximum value of the in-band phase noise is approximately −112 dBc/Hz at 1e+06 Hz.

By contrast, the in-band phase noise in the ADPLL 300 of the comparative example is approximately −105 dBc/Hz in an offset frequency range of 100 Hz to 20000 Hz, and the maximum value of the in-band phase noise is approximately −95 dBc/Hz at approximately 500000 Hz.

Note that the DCO 1 alone has a characteristic of the in-band phase noise being approximately −60 dBc/Hz at approximately 4000 Hz and exhibiting a linear decrease.

As described above, the ADPLL 100 of the first embodiment may be able to reduce the in-band phase noise by approximately 20 dBc/Hz, compared to the in-band phase noise in the ADPLL 300.

Second Embodiment

Figure 15:
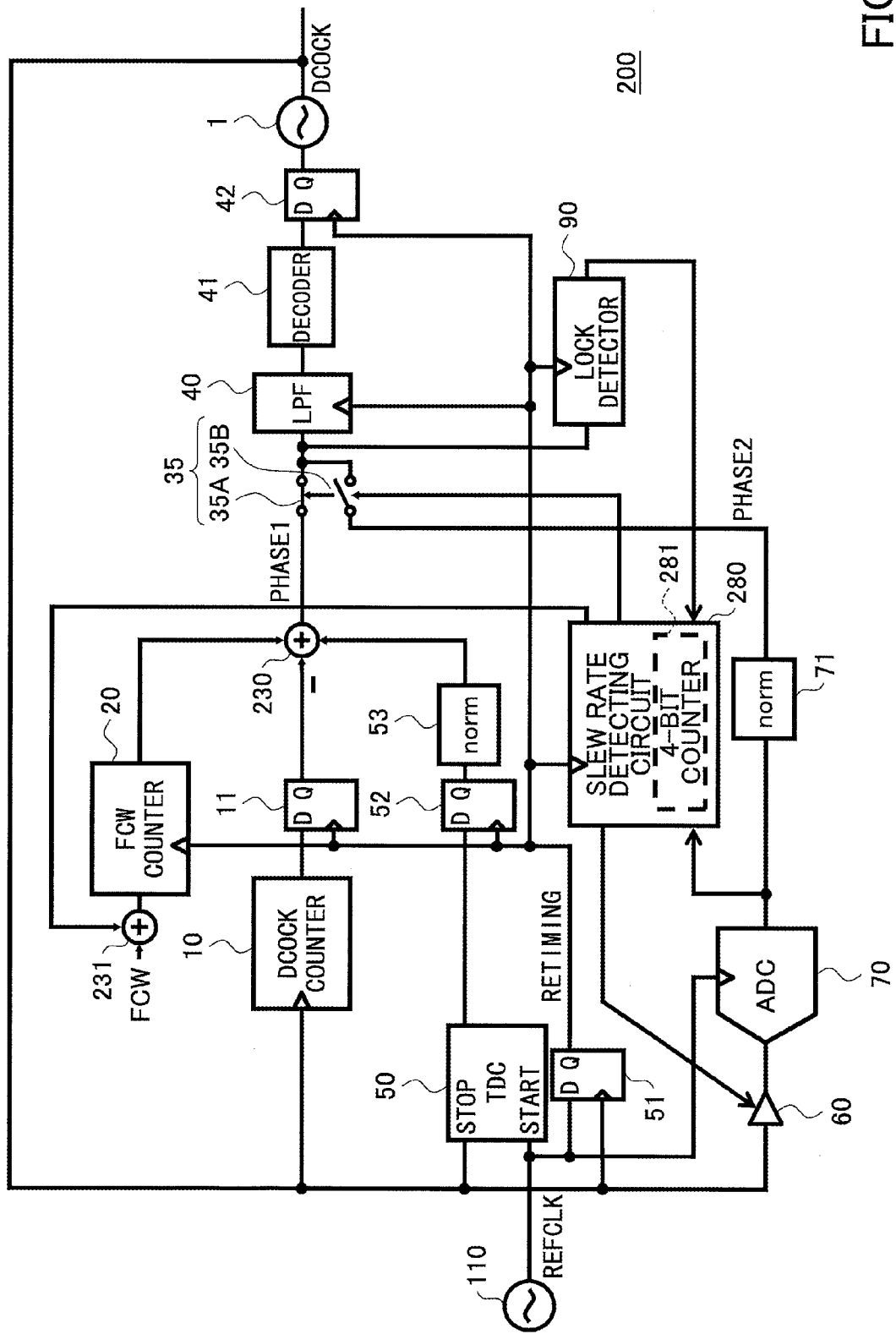
FIG. 15 is a block diagram illustrating a configuration of an ADPLL 200 of a second embodiment.

FIG. 15 is a block diagram illustrating a configuration of an ADPLL 200 of a second embodiment.

The ADPLL 200 of the second embodiment differs from the ADPLL 100 of the first embodiment in respective configurations of an adder 230 and a slew rate detecting circuit 280. The elements of the ADPLL 200 of the second embodiment except the adder 230 and the slew rate detecting circuit 280 that are similar to those of the ADPLL 100 of the first embodiment are designated by the same reference numerals, and descriptions of the similar elements are thus omitted from the description.

An input terminal of the adder 230 is connected to a data output terminal Q of a D-FF 11, an output terminal of an FCW counter 20, and an output terminal of a normalizing part 53. An output terminal of the adder 230 is connected to an input terminal of a switch 35A of a switching part 35.

The adder 230 outputs a value by adding a delayed amount input from the TDC 50 via the D-FF 52 and the normalizing part 53 to a value obtained by subtracting the counted number input from the DCOCK counter 10 via the D-FF 11 from the counted number input from the FCW counter 20. The value output by the adder 230 is a phase error signal PHASE 1 representing a phase error, which is supplied to an LPF 40 via the switch 35A of the switching part 35.

In the ADPLL 200 of the second embodiment, a fixed value output from the slew rate detecting circuit 280 is not supplied to the adder 230 but is supplied to an adder 231 disposed on an input side of the FCW counter 20. The fixed value indicates 1/16 of a time for one period of a clock of DCOCK, similar to the first embodiment.

An output terminal of the adder 231 is connected to an input terminal of the FCW counter 20, and the output terminal of the adder 231 receives an FCW and the fixed value output from the slew rate detecting circuit 280.

The slew rate detecting circuit 280 differs from the slew rate detecting circuit 80 of the ADPLL 100 of the first embodiment in that the slew rate detecting circuit 280 internally includes a 4-bit counter 281.

In the ADPLL 200 of the second embodiment having the above configuration, a process of switching from the TDC 50 to the ADC 70 executed by the slew rate detecting circuit 280 differs from the process of switching from the TDC 50 to the ADC 70 executed by the slew rate detecting circuit 80 in the ADPLL 100 of the first embodiment.

Figure 16:
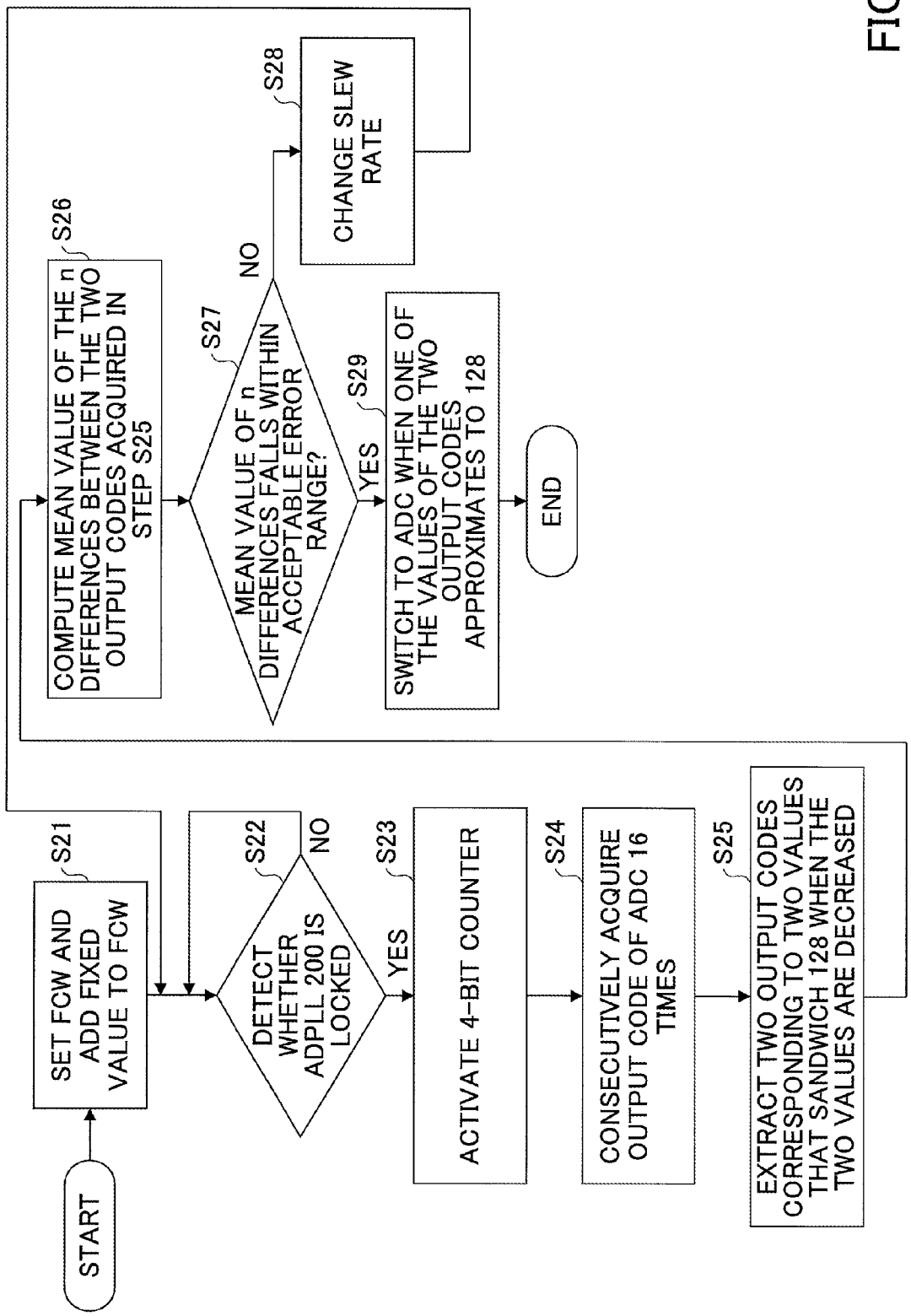
FIG. 16 is a flowchart illustrating a process of switching a TDC 50 to an ADC 70 in the ADPLL 200 of the second embodiment.

Next, illustration is given, with reference to FIG. 16, of a process executed by the slew rate detecting circuit 280 of the ADPLL 200 of the second embodiment.

FIG. 16 is a flowchart illustrating a process of switching from the TDC 50 to the ADC 70 in the ADPLL 200 of the second embodiment. FIG. 17 is a diagram illustrating an example of 4-bit table data for use in the process of switching from the TDC 50 to the ADC 70 in the ADPLL 200 of the second embodiment.

The flowchart illustrated in FIG. 16 may be implemented by the slew rate detecting circuit 280.

When the flow starts ("START" in FIG. 16), the slew rate detecting circuit 280 sets an FCW simultaneously with adding a fixed value to the set FCW (step S21). As s result of this step, the FCW counter 20 receives from the adder 231 a value obtained by adding the fixed value to the set FCW.

Subsequently, the slew rate detecting circuit 280 determines whether the ADPLL 200 utilizing the TDC 50 is locked (step S22).

Whether the ADPLL 200 is locked is determined based on whether a lock detecting signal is input from the lock detector 90 to the slew rate detecting circuit 280. The slew rate detecting circuit 280 repeatedly performs step S22 until the lock detecting signal is input from the lock detector 90 to the slew rate detecting circuit 280.

When the slew rate detecting circuit 280 determines that slew rate detecting circuit 280 has received the lock detecting signal from the lock detector 90 ("YES" in step S22), the slew rate detecting circuit 280 activates the 4-bit counter 281 (step S23).

Subsequently, the slew rate detecting circuit 280 consecutively acquires an output code of the ADC 70 16 times, and inputs the acquired output codes to the 4-bit counter 281 (step S24). As a result, 4-bit tabulated data are acquired as illustrated in FIG. 17. The tabulated data illustrated in FIG. 17 include output codes from the output code acquired in the first round (the counter code "0") to the output code acquired in the $16^{th}$ round (the counter code "15").

The counted number output from the FCW counter 20 every time the reference clock REFCLK is output is incremented by a value obtained by adding 1/16 of the clock of DCOCK to the FCW. Hence, the output codes acquired from the first round to the $16^{th}$ round are acquired by shifting a phase of the clock of DCOCK by 1/16 per output code. That is, the ADPLL 200 according the second embodiment is a fractional PLL. The 1/16 of the clock of DCOCK added to the FCW in the FCW counter 20 is an example of a predetermined decimal fraction added to the FCW.

The tabulated data in FIG. 17 illustrate the output code acquired in the first round (counter code "0") being "70", the output code acquired in the second round (counter code "1") being "90", and the output code acquired in the $10^{th}$ round (counter code "9") being "140". Further, the tabulated data in FIG. 17 illustrate the output code acquired in the $11^{th}$ round (counter code "10") being "110", the output code acquired in the $15^{th}$ round (counter code "14") being "80", and the output code acquired in the $16^{th}$ round (counter code "15") being "60".

Subsequently, the slew rate detecting circuit 280 extracts two output codes that sandwich 128 in an interval where values of the two output codes decrease, and the slew rate detecting circuit 280 further extracts the counter codes corresponding to the two output codes from the 4-bit counter 281 (step S25).

Subsequently, the slew rate detecting circuit 280 consecutively acquires two output codes n times corresponding to the two counter codes of the ADC 70 acquired in step S25, and computes the mean value of the differences between the two output codes that are acquired n times (step S26).

For example, when the slew rate detecting circuit 280 extracts the counter codes 9 and 10 in step S25, the slew rate detecting circuit 280 consecutively acquires via the 4-bit counter 281 the output codes of the counter codes 9 and 10 n times in step S26. The slew rate detecting circuit 280 then acquires the n differences between the acquired output codes of the counter code 9 and the acquired output codes of the counter code 10, and computes the mean value of the n differences in step S26.

Subsequently, the slew rate detecting circuit 280 compares the mean value of the n differences computed in step S26 and the predetermined setting value (step S27). The predetermined setting value indicates a value representing an acceptable error range. That is, in step S27, the slew rate detecting circuit 280 determines whether the mean value of the n differences acquired in step S26 falls within the acceptable error range.

The predetermined setting value may, for example, be set to 50±5. The predetermined setting value may be computed in advance in an experiment or the like utilizing the output code of the ADC 70 in a state where the ADPLL 200 is locked.

When the slew rate detecting circuit 280 determines that the mean value of the n differences computed in step S26 does not fall within the predetermined setting value ("NO" in step S27), the slew rate detecting circuit 280 proceeds with step S28 of the flow.

The slew rate detecting circuit 280 adjusts the slew rate of the slew rate adjusting buffer 60 (step S28). As a result of the comparison in step S27, when the mean value of the n differences computed in step S26 is less than the lower limit of the predetermined setting value, the slew rate detecting circuit 280 increases the slew rate, whereas when the mean value of the n differences computed in step S26 is greater than the upper limit of the predetermined setting value, the slew rate detecting circuit 280 decreases the slew rate.

When the slew rate detecting circuit 280 ends the process in step S28, the slew rate detecting circuit 280 returns to step S22 of the flow. As a result, the 4-bit counter 281 is activated based on the slew rate newly set in step S28. Thereafter, steps S22 to S28 are repeatedly executed in step S27 until the slew rate detecting circuit 280 determines that the mean value of the n differences computed in step S26 falls within the predetermined setting value ("YES" in step S27).

When the slew rate detecting circuit 280 determines that the mean value of the n differences computed in step S26 falls within the predetermined setting value ("YES" in step S27), the slew rate detecting circuit 280 proceeds with step S29 of the flow.

In step S29, when one of the values of the two output codes acquired in step S25 approximates 128 in the slew rate set in the final step S28, the slew rate detecting circuit 280 switches from the TDC 50 to the ADC 70 (step S29). The sequence of the processes thus ends ("END" in FIG. 16).

In the second embodiment, the resolution of the TDC 50 is three bits, and the resolution of the ADC 70 is eight bits. Thus, after switching from the TDC 50 to the ADC 70, the ADPLL 200 may be locked by the resolution of eight bits.

The resolution is high after switching from the TDC 50 to the ADC 70, so that jitter may be lowered by reducing in-band phase noise.

The ADC 70 output code of the ADPLL 200 of the second embodiment is eight bits. Hence, when the clock of DCOCK oscillates at 3 GHz, and a half period (approx. 167 ps) of the clock of DCOCK is divided by 256, a phase up to approximately 0.62 ps may be detected. This value is one digit smaller than 5 ps in the ADPLL 300 of the comparative example.

Thus, the ADPLL 100 according to the second embodiment may be able to significantly reduce jitter by substantially reducing the in-band phase noise.

Further, as described above, in the ADPLL 200 of the second embodiment, an optimal value of the slew rate of the slew rate adjusting buffer 60 is computed while the locked status in the TDC 50 is maintained, and switching from the TDC 50 to the ADC 70 is performed in a state where the optimal slew rate is set.

Hence, a pseudo-lock may be prevented from being generated after switching from the TDC 50 to the ADC 70.

In addition, in the ADPLL 200 of the second embodiment, the DCOCK counter 10, the FCW counter 20, and the TDC 50 are not used after switching from the TDC 50 to the ADC 70. Hence, the DCOCK counter 10, the FCW counter 20, and the TDC 50 may be deactivated.

Thus, according to the ADPLL 200 of the second embodiment, electric consumption may be reduced after switching from the TDC 50 to the ADC 70.

The first and second embodiments described above may be able to provide an ADPLL having high resolution.

The ADPLLs according to the first and the second embodiments are described above; however, the invention is not limited to those specifically disclosed as the first and the second embodiments. Various modifications or alterations may be made without departing from the scope of claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:
1. An ADPLL comprising:
a digital controlled oscillator;
a first counter configured to count a number of clocks fed back from the digital controlled oscillator;
a second counter configured to count a multiplication number representing a number of the clocks included in a reference clock;
a TDC configured to detect a delayed amount of a phase of the clocks fed back from the digital controlled oscillator with respect to a phase of the reference clock;
an adder configured to add the delayed amount detected by the TDC to a difference between the multiplication number counted by the second counter and the number of clocks counted by the first counter, and output the added result;
a slew rate setting part configured to receive the clocks fed back from the digital controlled oscillator to set a slew rate of the fed back clocks;
an ADC connected to an output side of the slew rate setting part and configured to receive the clocks to which the slew rate is set by the slew rate setting part;
a switching part configured to selectively switch between an output of the adder and an output of the ADC as an input into the digital controlled oscillator; and
a controller configured to control the slew rate in the slew rate setting part while shifting a phase of the clocks input from the TDC to the digital controlled oscillator to set a slew rate that realizes a lock point in the ADC in a status where the ADLL is locked by utilizing the TDC when the input of the digital controlled oscillator is switched from the output of the adder to the output of the ADC.

2. The ADPLL as claimed in claim 1, wherein
the controller shifts the phase of the clock input from the TDC to the digital controlled oscillator by adding a predetermined time obtained by dividing a clock period of the clock by a resolution lower than a resolution of the ADC to the clock input from the TDC to the digital controlled oscillator.

3. The ADPLL as claimed in claim 2, wherein
the controller computes a slew rate to realize the lock point of the ADC by repeatedly adding the predetermined time a number of times equal to a number of divisions of the clock period of the clock.

4. The ADPLL as claimed in claim 1, wherein
the controller computes a slew rate to realize a lock point of the ADC by acquiring two output codes that sandwich a middle value of all codes of the ADC, and controlling the slew rate in the slew rate setting part such that a difference between the two output codes falls within a predetermined acceptable range while shifting a phase of the clocks input from the TDC to the digital controlled oscillator.

5. The ADPLL as claimed in claim 1, wherein
the controller shifts the phase of the clock input from the TDC to the digital controlled oscillator by adding a predetermined time obtained by dividing a clock period of the clock by a resolution lower than a resolution of the ADC to the multiplication number counted by the second counter.

6. The ADPLL as claimed in claim 5, wherein
the controller computes the slew rate to realize the lock point of the ADC by repeatedly adding the predetermined time a number of times equal to a number of divisions of the clock period of the clock after the lock of the TDC has been detected.

7. An ADPLL comprising:
a digital controlled oscillator;
a first counter configured to count a number of clocks fed back from the digital controlled oscillator;
a second counter configured to count a value obtained by adding a predetermined decimal fraction to a multiplication number representing a number of the clocks included in a reference clock;

a TDC configured to detect a delayed amount of a phase of the clocks fed back from the digital controlled oscillator with respect to a phase of the reference clock;

an adder configured to add the delayed amount detected by the TDC to a difference between a counted value of the second counter and the number of clocks counted by the first counter, and output the added result;

a slew rate setting part configured to receive the clocks fed back from the digital controlled oscillator to set a slew rate of the fed back clocks;

an ADC connected to an output side of the slew rate setting part and configured to receive the clocks to which the slew rate is set by the slew rate setting part;

a switching part configured to selectively switch between an output of the adder and an output of the ADC as an input into the digital controlled oscillator; and a controller configured to control the slew rate in the slew rate setting part while shifting a phase of the clocks input from the TDC to the digital controlled oscillator to set a slew rate that realizes a lock point in the ADC in a status where the ADPLL is locked by utilizing the TDC when the input of the digital controlled oscillator is switched from the output of the adder to the output of the ADC.

* * * * *